(12) United States Patent
Lee et al.

(10) Patent No.: US 12,308,357 B2
(45) Date of Patent: May 20, 2025

(54) DISPLAY DEVICE

(71) Applicant: Samsung Display Co., LTD., Yongin-si (KR)

(72) Inventors: Jong Chan Lee, Suwon-si (KR); Hyun Wook Lee, Suwon-si (KR); Sang Jun Park, Daegu (KR); Myeong Hun Song, Daegu (KR); Kwang Taek Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1102 days.

(21) Appl. No.: 17/162,315

(22) Filed: Jan. 29, 2021

(65) Prior Publication Data

US 2021/0335765 A1  Oct. 28, 2021

(30) Foreign Application Priority Data

Apr. 24, 2020  (KR) ......................... 10-2020-0049997

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/24* (2013.01); *H01L 24/25* (2013.01); *H01L 24/32* (2013.01); *H01L 24/73* (2013.01); *H10D 86/021* (2025.01); *H10D 86/441* (2025.01); *H10D 86/451* (2025.01); *H10D 86/60* (2025.01); *H10H 20/857* (2025.01); *H01L 2224/24105* (2013.01); *H01L 2224/24147* (2013.01); *H01L 2224/25175* (2013.01); *H01L 2224/32145* (2013.01);
(Continued)

(58) Field of Classification Search
None
See application file for complete search history.

(56) References Cited

U.S. PATENT DOCUMENTS

| 2018/0019426 | A1* | 1/2018 | Im ........................ H10K 50/115 |
| 2020/0066699 | A1* | 2/2020 | Kim ..................... H01L 25/0753 |
| 2021/0242381 | A1 | 8/2021 | Lee et al. |

FOREIGN PATENT DOCUMENTS

| KR | 10-2018-0009015 | 1/2018 |
| KR | 10-2020-0001657 | 1/2020 |

(Continued)

*Primary Examiner* — Nilufa Rahim
(74) *Attorney, Agent, or Firm* — KILE PARK REED & HOUTTEMAN PLLC

(57) ABSTRACT

A display device comprises a plurality of first banks disposed on a substrate to extend in a first direction and spaced apart from one another, a plurality of first patterns disposed between the plurality of first banks and spaced apart from one another in the first direction, a first electrode and a second electrode extending in the first direction and disposed on different first banks of the plurality of first banks and spaced apart from each other, a first insulating layer overlapping the plurality of first patterns, disposed on the first substrate, and to partially overlapping the first and second electrodes, and a plurality of light-emitting elements disposed on the first insulating layer so that first and second ends of each of the plurality of light-emitting elements are disposed on the first and second electrodes, respectively.

17 Claims, 35 Drawing Sheets

(51) Int. Cl.
  *H10D 86/01*   (2025.01)
  *H10D 86/40*   (2025.01)
  *H10D 86/60*   (2025.01)
  *H10H 20/857*  (2025.01)

(52) U.S. Cl.
  CPC ............... *H01L 2224/73217* (2013.01); *H01L 2924/12041* (2013.01)

(56) References Cited

FOREIGN PATENT DOCUMENTS

| | | |
|---|---|---|
| KR | 10-2020-0004936 | 1/2020 |
| KR | 10-2020-0006208 | 1/2020 |
| KR | 10-2020-0010706 | 1/2020 |
| KR | 10-2020-0017009 | 2/2020 |
| KR | 10-2021-0098313 | 8/2021 |

* cited by examiner

DISPLAY DEVICE

CROSS REFERENCE TO RELATED APPLICATION(S)

This application claims priority to and the benefit of Korean Patent Application No. 10-2020-0049997 under 35 U.S.C. § 119, filed in the Korean Intellectual Property Office (KIPO) on Apr. 24, 2020, the entire contents of which are incorporated herein by reference.

BACKGROUND

1. Technical Field

The disclosure relates to a display device.

2. Description of the Related Art

Display devices have become highly important with the development of multimedia, and various types of display devices, such as an organic light-emitting diode (OLED) display device, a liquid crystal display (LCD) device, or the like, have been used.

A display device, which is a device for displaying an image, includes a display panel such as an OLED display panel or an LCD panel. The display panel may include light-emitting elements such as light-emitting diodes (LEDs), and the LEDs may be classified into OLEDs that use an organic material as a fluorescent material and inorganic LEDs (ILEDs) that use an inorganic material as a fluorescent material.

SUMMARY

Embodiments of the disclosure provide a display device capable of minimizing the number of light-emitting elements that are lost during the fabrication thereof.

Embodiments of the disclosure provide a display device with an improved alignment of light-emitting elements on electrodes.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to the aforementioned and other embodiments of the disclosure, a display device including a plurality of patterns, which are disposed between banks on which electrodes are arranged, is provided. The patterns are disposed to be spaced apart from one another in the direction in which the electrodes and the banks extend and can thus form height differences between the banks. The patterns, like the banks, can provide space in which light-emitting elements are arranged, and the light-emitting elements can be guided to be placed between the patterns, which are separate from one another, during the fabrication of the display device.

Accordingly, the number of light-emitting elements that fail to be connected to the electrodes and are lost because of being disposed in regions other than that between the banks can be minimized. Also, since light-emitting elements disposed between the patterns can have both ends thereof properly placed on the electrodes, the alignment of the light-emitting elements can be improved.

Other features and embodiments may be apparent from the following detailed description, the drawings, and the claims.

According to an embodiment of the disclosure, a display device may comprise a plurality of first banks disposed on a substrate to extend in a first direction and spaced apart from one another; a plurality of first patterns disposed between the plurality of first banks and spaced apart from one another in the first direction; a first electrode and a second electrode extending in the first direction, disposed on different first banks of the plurality of first banks, and spaced apart from each other; a first insulating layer overlapping the plurality of first patterns, disposed on the substrate, and partially overlapping the first and second electrodes; and a plurality of light-emitting elements disposed on the first insulating layer so that first and second ends of each of the plurality of light-emitting elements are disposed on the first and second electrodes, respectively, the plurality of light-emitting elements including first light-emitting elements which are disposed between the plurality of first patterns not and do not overlap the plurality of first patterns in a thickness direction of the display device.

The plurality of light-emitting elements may further comprise second light-emitting elements which overlap the plurality of first patterns in the thickness direction of the display device, and distances between the first light-emitting elements and the substrate may be smaller than distances between the second light-emitting elements and the substrate.

A thickness of the plurality of first patterns may be greater than thicknesses of the first and second electrodes.

The thickness of the plurality of first patterns may be smaller than a diameter of the plurality of light-emitting elements.

The plurality of first patterns may be disposed between the first and second electrodes, and a width of the plurality of first patterns may be smaller than a distance between the first and second electrodes.

A width of the plurality of first patterns may be greater than a distance between the first and second electrodes, and at least portions of the first and second electrodes may be disposed on the plurality of first patterns.

The display device may further comprise a planarization layer disposed on the substrate. The plurality of first banks and the first insulating layer may be disposed on the planarization layer, and the plurality of first patterns and the planarization layer may be integral with each other.

The plurality of first patterns may overlap portions of the first or second electrode that do not overlap the plurality of first banks and be arranged in the first direction.

First patterns of the plurality of first patterns that overlap the first electrode and first patterns of the plurality of first patterns that overlap the second electrode may be arranged parallel to a direction in which the first and second electrodes are spaced apart from each other.

First patterns of the plurality of first patterns that overlap the first electrode and first patterns of the plurality of first patterns that overlap the second electrode may be arranged in a staggered manner.

The display device may further comprise a first contact electrode disposed on the first electrode to be in electrical contact with first ends of the plurality of light-emitting elements and a second contact electrode disposed on the second electrode to be in electrical contact with second ends of the plurality of light-emitting elements.

The first electrode may include at least one bent portion which extends in a second direction that is different from the first direction, an extended portion which has a greater width than the at least one bent portion, and at least one connecting portion which electrically connects the bent portions and the extended portion and extends in the first direction, and the plurality of first patterns may be disposed between the extended portion of the first electrode and the second electrode.

The second electrode may be symmetrical with the first electrode with respect to the first insulating layer, the plurality of first patterns may be disposed between the extended portion of the first electrode and an extended portion of the second electrode, and a first end and a second end of each of the plurality of light-emitting elements may be disposed on the extended portions of the first and second electrodes, respectively.

A first distance between the extended portion of the first electrode and the second electrode may be smaller than a second distance between the at least one connecting portion of the first electrode and the second electrode, and a minimum distance between the at least one bent portion of the first electrode and the second electrode may be greater than the first distance and is smaller than the second distance.

According to an embodiment of the disclosure, a display device may comprise a planarization layer disposed on the substrate; a plurality of first banks disposed on the planarization layer and spaced apart from one another; a first electrode and a second electrode disposed on different first banks of the plurality of first banks and spaced apart from each other; a first insulating layer disposed on the planarization layer and partially overlapping the first and second electrodes; first light-emitting elements disposed on the first insulating layer so that a first end and a second end of each of the first light-emitting elements are disposed on the first electrode and the second electrode, respectively; and second light-emitting elements disposed on the first insulating layer so that a first end and a second end of each of the second light-emitting elements are disposed on the first electrode and the second electrode, respectively, wherein a distance between the first light-emitting elements and the substrate is smaller than a distance between the second light-emitting elements and the substrate.

The planarization layer may include first patterns including top surfaces partially protruding between the plurality of first banks, and the second light-emitting elements may be disposed on the first patterns.

The planarization layer may include portions between the plurality of first banks where the first patterns are not formed, and the first light-emitting elements may be disposed on the portions of the planarization layer where the first patterns are not formed.

The planarization layer may include recesses between the plurality of first banks. A top surface of the planarization layer may be recessed, at least portions of the first and second electrodes may be disposed in the recesses, and the first light-emitting elements may be disposed in the recesses.

The planarization layer may include portions between the plurality of first banks where the recesses are not formed, and the second light-emitting elements may be disposed on the portions of the planarization layer where the recesses are not formed.

The display device may further comprise a transistor disposed between the substrate and the planarization layer; and a data conductive layer disposed between the transistor and the planarization layer and including a first voltage line and second voltage line, wherein the first electrode may be electrically connected to the first voltage line via the transistor, and the second electrode may be electrically connected to the second voltage line.

BRIEF DESCRIPTION OF THE DRAWINGS

These and other aspects will become apparent and more readily appreciated from the following description of the embodiments, taken in conjunction with the accompanying drawings in which.

DETAILED DESCRIPTION OF THE EMBODIMENTS

Figure 1:
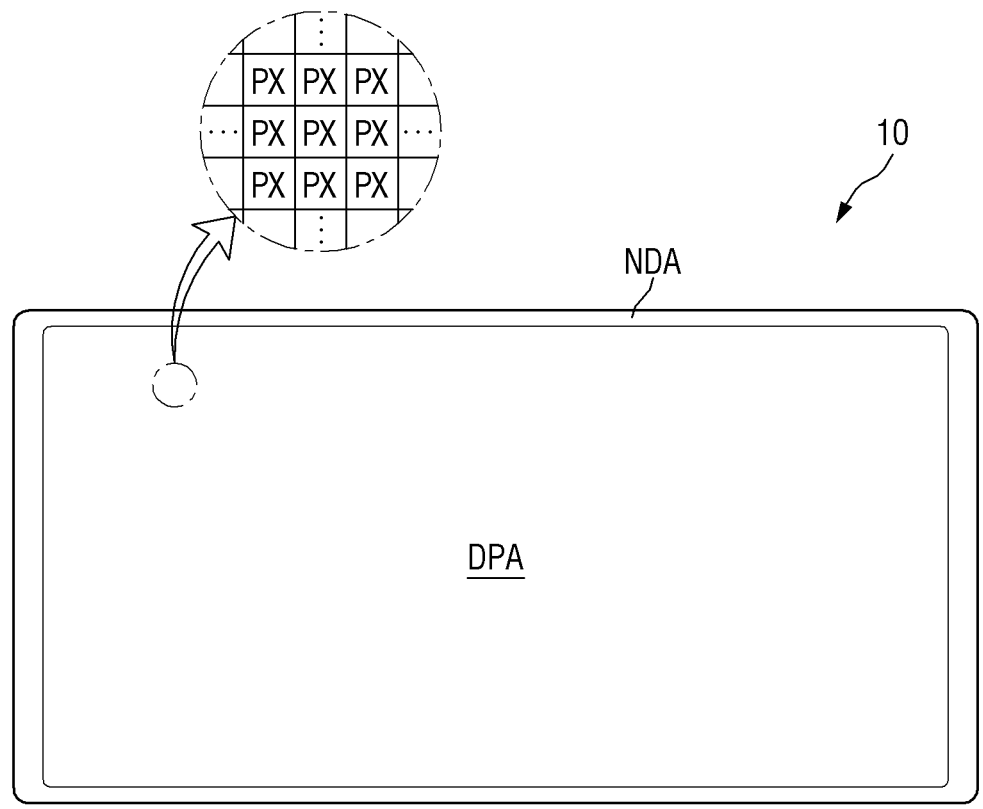
FIG. 1 is a schematic plan view of a display device according to an embodiment of the disclosure.
Figure 1:
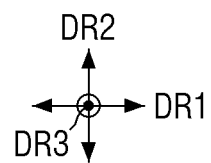

The disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or one or more intervening layers may also be present. The same reference numerals indicate the same components throughout the specification.

It will be understood that although the terms "first," "second," or the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings.

FIG. 1 is a schematic plan view of a display device according to an embodiment of the disclosure.

The terms "above," "top," and "on," as used herein, refer to an upward direction from a display device 10, i.e., one direction of a third direction DR3, and the terms "below," "bottom," and "under," as used herein, refer to a downward direction from the display device 10, i.e., the other direction of the third direction DR3. The terms "left," "right," "upper," and "lower," as used herein, refer to their respective directions as viewed from above the display device 10. For example, the terms ""left," "right," "upper," and "lower" refer to one direction of a first direction DR1, the other direction of the first direction DR1, one direction of a second direction DR2, and the other direction of the second direction DR2, respectively.

Referring to FIG. 1, a display device 10 displays a moving or still image. The display device 10 may refer to nearly all types of electronic devices that include a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that includes a display screen. Examples of the display panel include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the disclosure is not limited thereto.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a rectangular shape with rounded corners, another polygonal shape, or a circular shape. A display area DPA of the display device 10 may have a similar shape to the display device 10. FIG. 1 illustrates that the display device 10 and the display area DPA have a rectangular shape that extends longer in the horizontal direction than in the vertical direction.

The display device 10 may include the display area DPA and a non-display area NDA. The display area DPA is an area in which an image is displayed, and the non-display area NDA is an area in which an image is not displayed. The display area DPA may also be referred to as an active area, and the non-display area NDA may also be referred to as an inactive area. The display area DPA may generally account for a middle portion of the display device 10.

The display area DPA may include pixels PX. The pixels PX may be arranged in row and column directions. The pixels PX may have a rectangular or square shape in a plan view, but the disclosure is not limited thereto. As another example, the pixels PX may have a rhombus shape that is inclined with respect to the first or second direction. As another example, the pixels PX may be arranged in a stripe fashion or a PenTile® fashion. Each of the pixels PX may include one or more light-emitting elements 30 that emit light of a predetermined wavelength range to emit light of a predetermined color.

The non-display area NDA may be disposed on the periphery of the display area DPA. The non-display area NDA may surround the entire display area DPA or a portion of the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted in the non-display area NDA.

Figure 2:
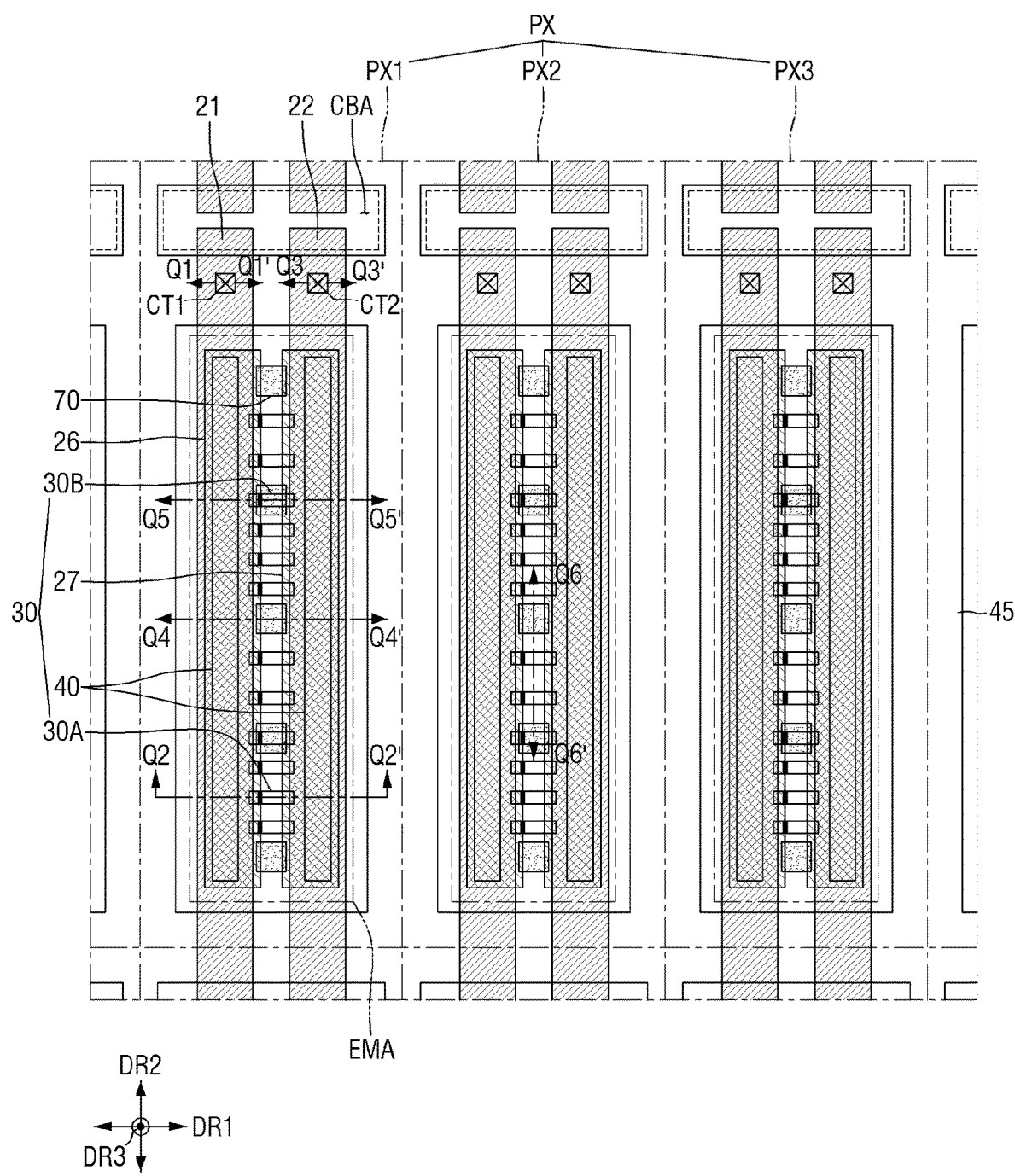
FIG. 2 is a schematic plan view of a pixel of the display device of FIG. 1.

FIG. 2 is a schematic plan view of a pixel of the display device of FIG. 1.

Referring to FIG. 2, a pixel PX may include subpixels PXn (where n is an integer of 1 to 3). For example, the pixel PX may include first, second, and third subpixels PX1, PX2, and PX3. The first subpixel PX1 may emit light of a first color, the second subpixel PX2 may emit light of a second color, and the third subpixel PX3 may emit light of a third color. The first, second, and third colors may be blue, green, and red, respectively, but the disclosure is not limited thereto. As another example, the subpixels PXn may emit light of the same color. FIG. 2 illustrates that the pixel PX includes three subpixels PXn, but the disclosure is not limited thereto. As another example, the pixel PX may include more than three subpixels PXn.

Each of the subpixels PXn may include an emission area EMA and a non-emission area. The emission area EMA may be an area in which one or more light-emitting elements 30 are disposed to emit light of a particular wavelength range, and the non-emission area may be an area that light emitted from the light-emitting elements 30 does not extend to and no light is thus emitted from. The emission area EMA may include an area in which the light-emitting elements 30 are disposed, and an area that outputs light emitted from the light-emitting elements 30.

However, the disclosure is not limited to this. The emission area EMA may further include an area in which light emitted from the light-emitting elements 30 is reflected or refracted by another element. Light-emitting elements 30 may be disposed in the subpixels PXn and emission areas EMA, including areas where the light-emitting elements 30 are disposed and areas adjacent to the areas where the light-emitting elements 30 are disposed, may be formed.

Each of the subpixels PXn may include a cut area CBA, which is disposed in the non-emission area. The cut area CBA may be disposed on one side, in the second direction DR2, of the emission area EMA. The cut area CBA may be disposed between emission areas EMA of a pair of adjacent subpixels PXn in the second direction DR2. In the display area DPA of the display device 10, emission areas EMA and cut areas CBA may be arranged. For example, the emission areas EMA or the cut areas CBA may be arranged one after another in the first direction DR1, and the emission areas EMA or the cut areas CBA may be alternately arranged in the second direction DR2. The distance, in the first direction DR1, between the cut areas CBA may be smaller than the distance, in the first direction DR1, between the emission areas EMA. A second bank 45 may be disposed between the cut areas CBA and the emission areas EMA, and the distance between the cut areas CBA and the emission areas EMA may be determined by the width of the second bank 45. No light-emitting elements 30 are disposed in the cut areas CBA so that no light is emitted from the cut areas CBA, but portions of electrodes 21 and 22 disposed in each of the subpixels PXn may be disposed in the corresponding cut area CBA to be separated from each other.

Figure 3:
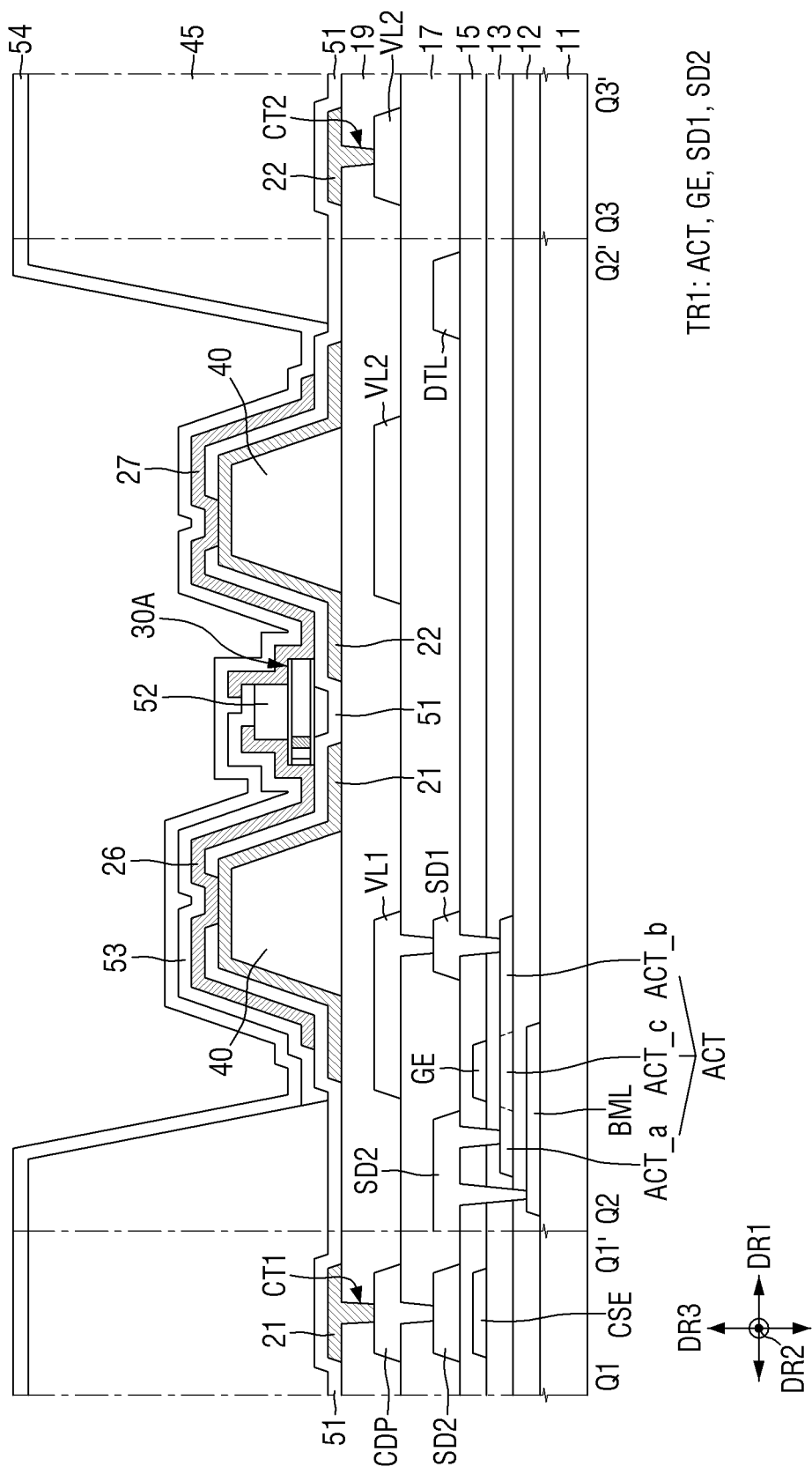
FIG. 3 is a schematic cross-sectional view taken along lines Q1-Q1', Q2-Q2', and Q3-Q3' of FIG. 2.
Figure 4:
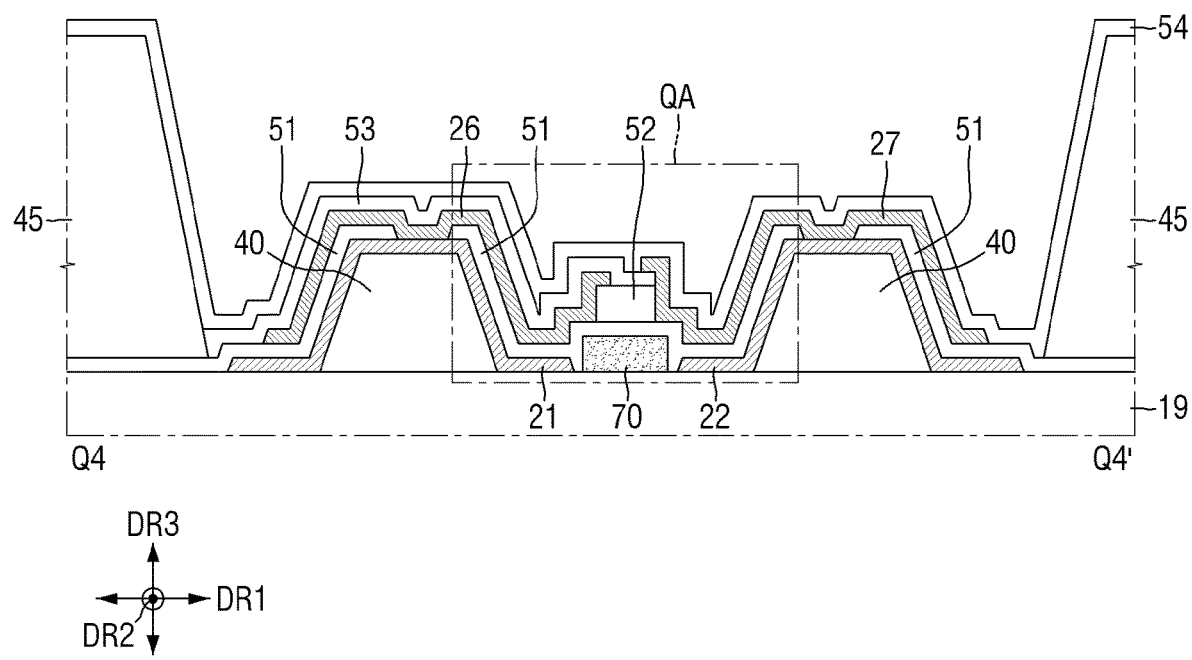
FIG. 4 is a schematic cross-sectional view taken along line Q4-Q4' of FIG. 2.
Figure 5:
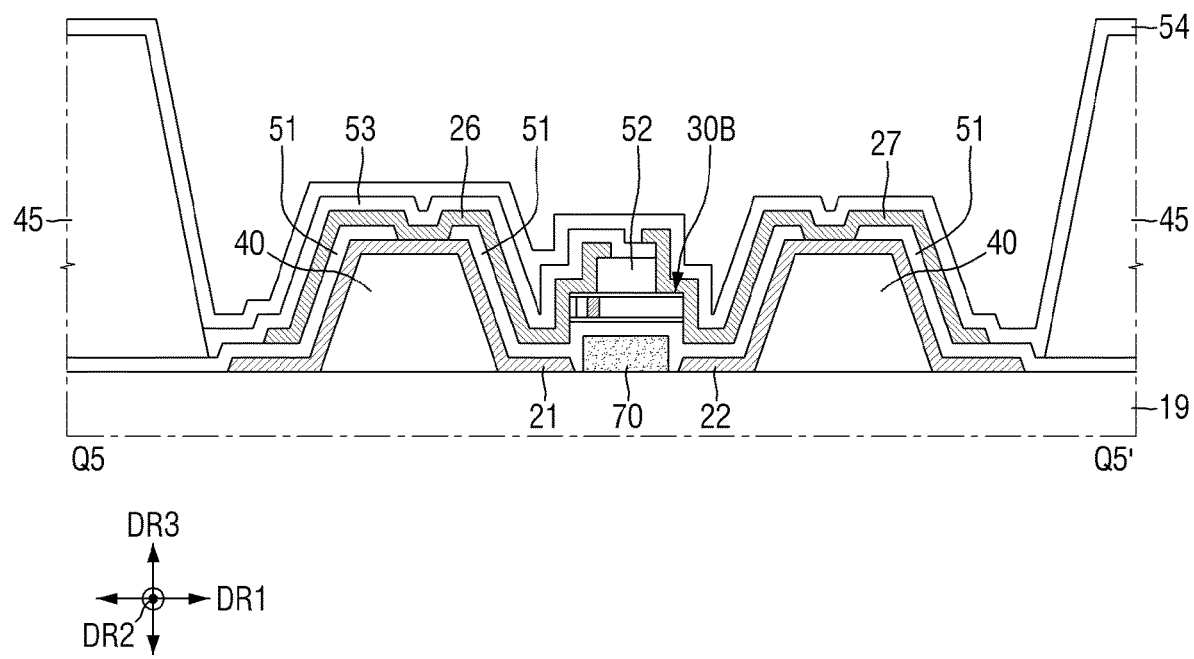
FIG. 5 is a schematic cross-sectional view taken along line Q5-Q5' of FIG. 2.

FIG. 3 is a schematic cross-sectional view taken along lines Q1-Q1', Q2-Q2', and Q3-Q3' of FIG. 2. FIG. 4 is a schematic cross-sectional view taken along line Q4-Q4' of FIG. 2. FIG. 5 is a schematic cross-sectional view taken along line Q5-Q5' of FIG. 2. Specifically, FIG. 3 illustrates a schematic cross-sectional view of the first subpixel PX1 of FIG. 2, but the structure of the first subpixel PX1 illustrated in FIG. 3 may be directly applicable to other pixels PX or other subpixels PXn. FIG. 3 illustrates a schematic cross-sectional view taken along the first direction DR1 of first light-emitting elements 30A and second light-emitting elements 30B of the first subpixel PX1. FIG. 4 illustrates a schematic cross-sectional view of first patterns 70 of the first subpixel PX1 with no light-emitting elements 30 disposed thereon, and FIG. 5 illustrates a schematic cross-sectional view of first patterns 70 of the first subpixel PX1 with light-emitting elements 30 disposed thereon.

Referring to FIGS. 3 through 5 and further to FIG. 2, the display device 10 may include a first substrate 11 and a semiconductor layer, conductive layers, and insulating layers, which are disposed on the first substrate 11.

The first substrate 11 may be an insulating substrate. The first substrate 11 may be formed of an insulating material such as glass, quartz, or a polymer resin. Also, the first substrate 11 may be a rigid substrate but may be a flexible substrate that is bendable, foldable, or rollable.

A light-blocking layer BIL may be disposed on the first substrate 11. The light-blocking layer BIL is disposed to overlap an active layer ACT of a first transistor TR1. The light-blocking layer BIL may include a material capable of blocking light and may prevent light from being incident upon the active layer ACT of the first transistor TR1. For example, the light-blocking layer BIL may be formed of an opaque metal capable of blocking the transmission of light, but the disclosure is not limited thereto. In some embodiments, the light-blocking layer BMIL may not be provided.

A buffer layer 12 may be disposed on the entire surface of the first substrate 11 including the light-blocking layer BML. The buffer layer 12 may be formed on the first substrate 11 to protect the first transistor TR1, which is susceptible to moisture, from moisture that may penetrate the first substrate 11 and may perform a surface planarization function. The buffer layer 12 may include inorganic layers that are alternately stacked. For example, the buffer layer 12 may be formed as a multilayer film in which inorganic layers including at least one of silicon oxide ($SiO_x$), silicon nitride ($SiN_x$), and silicon oxynitride (SiON) are alternately stacked.

The semiconductor layer is disposed on the buffer layer 12. The semiconductor layer may include the active layer ACT of the first transistor TR1. The semiconductor layer may be disposed to partially overlap a gate electrode GE in a first gate conductive layer.

FIG. 3 illustrates only the first transistor TR1 of the first subpixel PX1, but the number of transistors included in the first subpixel PX1 is not particularly limited. The first subpixel PX1 may include more than one transistor. For example, the first subpixel PX1 may include more than one transistor including the first transistor TR1, for example, two or three transistors.

The semiconductor layer may include polycrystalline silicon, monocrystalline silicon, or an oxide semiconductor. In a case where the semiconductor layer includes an oxide semiconductor, the active layer ACT may include conductor regions (ACT_a and ACT_b) and a channel region ACT_c between the conductor regions (ACT_a and ACT_b). The oxide semiconductor may be an oxide semiconductor including indium (In). In some embodiments, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO), but the disclosure is not limited thereto.

As another example, the semiconductor layer may include polycrystalline, which is formed by crystallizing amorphous silicon. In this case, the conductor regions (ACT_a and ACT_b) of the active layer ACT may be regions doped with impurities.

A first gate insulating layer 13 is disposed on the semiconductor layer and the buffer layer 12. The first gate insulating layer 13 may include a semiconductor layer and may be disposed on the buffer layer 12. The first gate insulating layer 13 may function as the gate insulating film of each of transistors. The first gate insulating layer 13 may be formed as an inorganic layer including an inorganic material such as, for example, $SiO_x$, $SiN_x$, or SiON or as a stack of $SiO_x$, $SiN_x$, and/or SiON.

The first gate conductive layer is disposed on the first gate insulating layer 13. The first gate conductive layer may include the gate electrode GE of the first transistor TR1 and a first capacitor electrode CSE of a storage capacitor. The gate electrode GE may be disposed to overlap the channel region ACT_c of the active layer ACT in a thickness direction. The first capacitor electrode CSE may be disposed to overlap a first source/drain electrode SD1 of the first transistor TR1 in the thickness direction. In some embodiments, the first capacitor electrode CSE may be connected to, and be integrated into a single layer with, the gate electrode GE, and the single layer may include, in part, the gate electrode GE and the first capacitor electrode CSE. The first capacitor electrode CSE may be disposed to overlap the first source/drain electrode SD1 in the thickness direction so that the storage capacitor may be formed between the first capacitor electrode CSE and the first source/drain electrode SD1.

The first gate conductive layer may be formed as a single- or multilayer film including molybdenum (Mo), aluminum (Al), chromium (Cr), gold (Au), titanium (Ti), nickel (Ni), neodymium (Nd), copper (Cu), or an alloy thereof, but the disclosure is not limited thereto.

A first passivation layer 15 is disposed on the first gate conductive layer. The first passivation layer 15 may cover or overlap the first gate conductive layer to protect the first gate conductive layer. The first passivation layer 15 may be formed as an inorganic layer including an inorganic material such as, for example, $SiO_x$, $SiN_x$, or SiON or as a stack of $SiO_x$, $SiN_x$, and/or SiON.

A first data conductive layer is disposed on the first passivation layer 15. The first data conductive layer may include the first source/drain electrode SD1, a second source/drain electrode SD2, and a data line DTL.

Source/drain electrodes (SD1 and SD2) of the first transistor TR1 may be in electrical contact with the conductor regions (ACT_a and ACT_b) of the active layer ACT via contact holes that penetrate the first interlayer insulating layer 17 and the first gate insulating layer 13. The second source/drain electrode SD2 of the first transistor TR1 may be electrically connected to the light-blocking layer BML via another contact hole.

The data line DTL may apply a data signal to other transistors (not illustrated) of the first subpixel PX1. Although not specifically illustrated, the data line DTL may be electrically connected to the source/drain electrodes of the other transistors and may transmit the data signal to the source/drain electrodes of the other transistors.

The first data conductive layer may be formed as a single- or multi-layer film including Mo, Al, Cr, Au, Ti, Ni, Nd, Cu, or an alloy thereof, but the disclosure is not limited thereto.

The first interlayer insulating layer 17 is disposed on the first data conductive layer. The first interlayer insulating layer 17 may function as an insulating film between the first data conductive layer and layers disposed on the first data conductive layer. Also, the first interlayer insulating layer 17 may cover or overlap the first data conductive layer to protect the first data conductive layer. The first interlayer insulating layer 17 may be formed as an inorganic layer including an inorganic material such as, for example, $SiO_x$, $SiN_x$, or SiON or as a stack of $SiO_x$, $SiN_x$, and/or SiON.

A second data conductive layer is disposed on the first interlayer insulating layer 17. The second data conductive layer may include a first voltage line VL1, a second voltage line VL2, and a first conductive pattern CDP. A high-potential voltage (or the first power supply voltage) provided to the first transistor TR1 may be applied to the first voltage line VL1, and a low-potential voltage (or the second power supply voltage) provided to a second electrode 22 may be applied to the second voltage line VL2. A light-emitting element alignment signal for aligning light-emitting elements 30 may also be applied to the second voltage line VL2 during the fabrication of the display device 10.

The first conductive pattern CDP may be electrically connected to the second source/drain electrode SD2 of the first transistor TR1 via a contact hole formed in the first interlayer insulating layer 17. The first conductive pattern CDP may be in electrical contact with a first electrode 21 that will be described below. The first transistor TR1 may transmit the first power supply voltage, applied from the first voltage line VL1, to the first electrode 21 via the first conductive pattern CDP. The second data conductive layer is illustrated as including one first voltage line VL1 and one second voltage line VL2, but the disclosure is not limited thereto. As another example, the second data conductive layer may include more than one first voltage line VL1 and more than one second voltage line VL2.

The second data conductive layer may be formed as a single- or multi-layer film including Mo, Al, Cr, Au, Ti, Ni, Nd, Cu, or an alloy thereof, but the disclosure is not limited thereto.

A first planarization layer 19 is disposed on the second data conductive layer. The first planarization layer 19 may include an organic insulating material such as, for example, polyimide (PI), and may perform a surface planarization function.

First banks 40, first patterns 70, electrodes (21 and 22), light-emitting elements 30, a second bank 45, and contact electrodes (26 and 27) may be disposed on the first planarization layer 19. Insulating layers (51, 52, 53, and 54) may be further disposed on the first planarization layer 19.

The first banks 40 may be disposed directly on the first planarization layer 19. The first banks 40 may extend in the second direction DR2 within the first subpixel PX1; may not extend into neighboring subpixels PXn, in the second direction DR2, of the first subpixel PX1; and may be disposed in an emission area EMA of the first subpixel PX1. The first banks 40 may be disposed to be spaced apart from one another in the first direction DR1 and may form a region where the light-emitting elements 30 are to be disposed. The first banks 40 may be disposed in each subpixel PXn to form linear patterns in the display area DPA of the display device 10. Two first banks 40 are illustrated as being provided in the first subpixel PX1, but the disclosure is not limited thereto. More than two first banks 40 may be disposed in the first subpixel depending on the number of electrodes (21 and 22) that will be described below.

The first banks 40 may protrude, at least in part, from the top surface of the first planarization layer 19. Portions of the first banks 40 that protrude may have inclined sides surfaces, and light emitted from the light-emitting elements 30 may travel toward the inclined side surfaces. The electrodes (21 and 22), which are disposed on the first banks 40, may include a material with high reflectance, and light emitted from the light-emitting elements 30 may be reflected to be emitted in an upward direction from the first planarization layer 19. For example, the first banks 40 may not only provide an area in which to arrange the light-emitting elements 30, but also may function as a reflecting barrier capable of reflecting light emitted from the light-emitting elements 30 in the upward direction from the first planarization layer 19. The sides of the first banks 40 may be linearly inclined, but the disclosure is not limited thereto. As another example, the first banks 40 may have a semi-circular or elliptical shape with a curved outer surface. The first banks 40 may include an organic insulating material such as PI, but the disclosure is not limited thereto.

The display device 10 may include first patterns 70, which are disposed between the first banks 40. The first patterns 70 may have a smaller width than the first banks 40 and may be disposed to be spaced apart from one another in the second direction DR2, between the first banks 40. The width of the first patterns 70 may be smaller than the distance between the first banks 40, and the first patterns 70 may be spaced apart from the first banks 40. In some embodiments, the first patterns 70 and the first banks 40 may include the same material and may be formed at the same time.

As already mentioned above, the first banks 40 may form the region where the light-emitting elements 30 are to be disposed. During the fabrication of the display device 10, ink having the light-emitting elements 30 scattered therein may be sprayed on the electrodes (21 and 22), and the light-emitting elements 30 may be arranged on the electrodes (21 and 22) by an electric field generated on the electrodes (21 and 22). Here, the first banks 40 may protrude from the top surface of the first planarization layer 19 to define a region therebetween and a region on the outside thereof and may guide the light-emitting elements 30 to be placed between the first banks 40. Similarly, the first patterns 70, which are disposed between the first banks 40, may generate height differences in the region between the first banks 40 where the light-emitting elements 30 are disposed. Thus, regions where the first patterns 70 are disposed may be differentiated from regions between the first patterns 70 spaced apart from one another in the second direction DR2, and the light-emitting elements 30 may be guided to be placed between the first patterns 70. As a result, the light-emitting elements 30 can be densely arranged in a particular area between the first banks 40, and both ends of each of the light-emitting elements 30 can be properly arranged on the electrodes (21 and 22). The first patterns 70 will be described below in detail.

Electrodes (21 and 22) are disposed on the first bank 40 and the first planarization layer 19. The electrodes (21 and 22) may include the first and second electrodes 21 and 22. The first and second electrodes 21 and 22 may extend in the second direction DR2 and may be spaced apart from each other in the first direction DR1.

The first and second electrodes 21 and 22 may extend in the second direction DR2 in each subpixel PXn and may be separated from other electrodes (21 and 22) by the cut area CBA of the corresponding subpixel PXn. In some embodiments, a cut area CBA may be disposed between the emission areas EMA of two adjacent subpixels PXn in the second direction DR2, and first and second electrodes 21 and 22 of one of the two adjacent subpixels PXn may be separated from first and second electrodes 21 and 22 of the other subpixel PXn, but the disclosure is not limited thereto. As another example, some electrodes (21 and 22) may not be segmented between subpixels PXn, but may extend across the boundary between each pair of adjacent subpixels PXn in the second direction DR2, or only one of the first and second electrodes 21 and 22 may be segmented between the subpixels PXn.

The first electrode 21 may be electrically connected to the first transistor TR1 via a first contact hole CT1, and the second electrode 22 may be electrically connected to the second voltage line VL2 via a second contact hole CT2. For example, the first electrode 21 may be in electrical contact with the first conductive pattern CDP via the first contact hole CT1, which penetrates the first planarization layer 19 in an area where the second bank 45 extends in the first direction DR1, and the second electrode 22 may be in electrical contact with the second voltage line VL2 via a second contact hole CT2, which penetrates the first planarization layer 19 in the area where the second bank 45 extends in the first direction DR1. However, the disclosure is not limited to this example. In another example, the first and second contact holes CT1 and CT2 may be disposed in the emission area EMA surrounded by the second bank 45 not to overlap the second bank 45.

One first electrode 21 and one second electrode 22 are illustrated as being provided in each subpixel PXn, but the disclosure is not limited thereto. More than one first electrode 21 and more than one second electrode 22 may be provided in each subpixel PXn. Also, in each subpixel PXn, the first and second electrodes 21 and 22 may not necessarily extend in one direction but may be arranged in various other fashions. For example, the first and second electrodes 21 and 22 may be partially curved or bent, or one of the first and second electrodes 21 and 22 may be disposed to surround the other electrode.

The first and second electrodes 21 and 22 may be disposed on their respective first banks 40. In some embodiments, the first and second electrodes 21 and 22 may be formed to have a greater width than the first banks 40. For example, the first and second electrodes 21 and 22 may be formed to cover the outer surfaces of their respective first banks 40. The first and second electrodes 22 may be disposed on the sides of their respective first banks 40, and the distance between the first and second electrodes 21 and 22 may be smaller than the distance between the first banks 40. The first and second electrodes 21 and 22 may be disposed, at least in part, directly on the first planarization layer 19 and may thus be on the same plane.

The electrodes (21 and 22) may include a conductive material with high reflectance. For example, the electrodes (21 and 22) may include a metal with high reflectance such as Ag, Cu, or Al or may include an alloy of Al, Ni, or La. The electrodes (21 and 22) may reflect light emitted from the light-emitting elements 30 to travel toward the sides of the first banks 40 in an upward direction from each subpixel PXn.

However, the disclosure is not limited to this, and the electrodes (21 and 22) may further include a transparent conductive material. For example, the electrodes (21 and 22) may include a material such as ITO, IZO, or ITZO. In some embodiments, each of the electrodes (21 and 22) may form a structure in which a transparent conductive material and a metal with high reflectance are stacked into more than one layer, or may be formed as a single layer including a transparent conductive material and a metal with high reflectance. For example, each of the electrodes (21 and 22) may have a stack of ITO/Ag/ITO, ITO, ITO/Ag/IZO, or ITO/Ag/ITZO/IZO.

The electrodes (21 and 22) may be electrically connected to the light-emitting elements 30, and a predetermined voltage may be applied to each of the electrodes (21 and 22) so that the light-emitting elements 30 can emit light. For example, the electrodes (21 and 22) may be electrically connected to the light-emitting elements 30 via the contact electrodes (26 and 27) that will be described below, and may transmit electrical signals applied thereto to the light-emitting elements 30 via the contact electrodes (26 and 27).

One of the first and second electrodes 21 and 22 may be electrically connected to anode electrodes of the light-emitting elements 30, and the other electrode of the first and second electrodes 21 and 22 may be electrically connected to cathode electrodes of the light-emitting elements 30. However, the disclosure is not limited to this. As another example, one of the first and second electrodes 21 and 22 may be electrically connected to the cathode electrodes of the light-emitting elements 30, and the other electrode of the first and second electrodes 21 and 22 may be electrically connected to the anode electrodes of the light-emitting elements 30.

The electrodes (21 and 22) may be used to generate an electric field in each subpixel PXn to align the light-emitting elements 30. The light-emitting elements 30 may be arranged between the first and second electrodes 21 and 22 by the electric field formed on the first and second electrodes 21 and 22. The light-emitting elements 30 may be sprayed on the electrodes (21 and 22) via inkjet printing. If ink including the light-emitting elements 30 is sprayed on the electrodes (21 and 22), alignment signals may be applied to the electrodes (21 and 22) to generate an electric field. The light-emitting elements 30 scattered in the ink may receive a dielectrophoretic force from the electric field generated on the electrodes (21 and 22) and may thus be properly aligned on the electrodes (21 and 22).

A first insulating layer 51 is disposed on the first planarization layer 19. The first insulating layer 51 may be disposed to cover the first banks 40, the first and second electrodes 21 and 22, and the first patterns 70, over the first planarization layer 19, but to expose portions of the top surfaces of the first and second electrodes 21 and 22. In other words, the first insulating layer 51 may be formed substantially on the entire surface of the first planarization layer 19 and may include openings (not illustrated) that expose portions of the first and second electrodes 21 and 22.

For example, portions of the top surface of the first insulating layer 51 may be recessed between the first and second electrodes 21 and 22 to generate height differences. As the first insulating layer 51 is disposed to cover or overlap the first patterns 70 between the first banks 40, height differences may be generated in portions of the top surface of the first insulating layer 51 along the direction in which the first patterns 70 are arranged, i.e., along the second direction DR2. As the first insulating layer 51 is disposed to cover the first and second electrodes 21 and 22, even in the regions where the first patterns 70 are not disposed, height differences may be generated even in portions of the top surface of the first insulating layer 51 between the first and second electrodes 21 and 22. However, the disclosure is not limited to this.

The first insulating layer 51 may protect the first and second electrodes 21 and 22 and may insulate the first and second electrodes 21 and 22 from each other. Also, the first insulating layer 51 may prevent the light-emitting elements 30, which are disposed on the first insulating layer 51, from being in direct contact with, and damaged by, other elements.

The second bank 45 may be disposed on the first insulating layer 51. In a plan view, the second bank 45 may include portions that extend in the first direction DR1 and portions that extend in the second direction DR2 and may be arranged in a lattice pattern on the entire surface of the display area DPA. The second bank 45 may be disposed along the boundaries of each subpixel PXn to define each subpixel PXn.

The second bank 45 may be disposed to surround the emission area EMA and the cut area CBA of each subpixel PXn to separate the emission area EMA and the cut area CBA of each subpixel PXn. The first and second electrodes 21 and 22 may extend in the second direction DR2 across the portions of the second bank 45 that extend in the first direction DR1. The portions of the second bank 45 that extend in the second direction DR2 may have a greater width between emission areas EMA of each pair of adjacent subpixels PXn than between cut areas CBA of each pair of adjacent subpixels PXn. Accordingly, the distance between the cut areas CBA may be smaller than the distance between the emission areas EMA.

The second bank 45 may be formed to have a greater height than the first banks 40. The second bank 45 may prevent ink from spilling over between different subpixels PXn during an inkjet printing process during the fabrication of the display device 10. The second bank 45 may separate ink having the light-emitting elements 30 scattered therein between different subpixels PXn and may prevent mixture of the ink. The second bank 45, like the first banks 40, may include polyimide (PI), but the disclosure is not limited thereto.

The light-emitting elements 30 may be disposed on the first insulating layer 51. Light-emitting elements 30 may be disposed to be spaced apart from one another in the direction in which the electrodes (21 and 22) extend, i.e., in the second direction DR2, and may be aligned substantially in parallel to one another. The distance between the light-emitting elements 30 is not particularly limited. The light-emitting elements 30 may extend in one direction, and the direction in which the electrodes (21 and 22) extend may form a substantially right angle with the direction in which the light-emitting elements 30 extend. However, the disclosure is not limited to this. As another example, the light-emitting elements 30 may be arranged diagonally with respect to the direction in which the electrodes (21 and 22) extend.

The light-emitting elements 30 may include light-emitting layers 36 having different materials and may emit light of different wavelength ranges to the outside. The display device 10 may include light-emitting elements 30 that emit light of different wavelength ranges. Accordingly, the first, second, and third subpixels PX1, PX2, and PX3 can emit light of the first, second, and third colors, respectively, but the disclosure is not limited thereto. As another example, the subpixels PXn may include light-emitting elements 30 of the same type and may emit light of substantially the same color.

The light-emitting element 30 may be arranged between the first banks 40 so that both ends thereof may be placed on the electrodes (21 and 22). For example, first ends of the light-emitting elements 30 may be disposed on the first electrode 21, and second ends of the light-emitting elements 30 may be disposed on the second electrode 22. The length of the light-emitting elements 30 may be greater than the distance between the first and second electrodes 21 and 22, and both ends of each of the light-emitting elements 30 may be disposed on the first and second electrodes 22.

The light-emitting elements 30 may be disposed between the first patterns 70 or on the first patterns 70. For example, the light-emitting elements 30 may include first light-emitting elements 30A, which are disposed in the regions where the first patterns 70 are not disposed, and second light-emitting elements 30B, which are disposed on the first patterns 70. The first insulating layer 51 may be disposed between the first banks 40 and between the first and second electrodes 21 and 22 to cover the first patterns 70. The light-emitting elements 30, which are disposed on the first insulating layer 51, may be disposed on portions of the first insulating layer 51 that are relatively low between the first patterns 70, and at least some of the light-emitting elements 30 may be disposed to overlap the first patterns 70 in the thickness direction. FIG. 3 illustrates a schematic cross-sectional view taken from one end to the other end of one of the first light-emitting elements 30A, and FIG. 4 illustrates a schematic cross-sectional view taken from one end to the other end of one of the second light-emitting elements 30B. For example, the first patterns 70 may be disposed between the first banks 40 to generate height differences in the first insulating layer 51, and the light-emitting elements 30 may include first light-emitting elements 30A that are located relatively low and second light-emitting elements 30B that are located relatively high. As the first patterns 70 are provided, most of the light-emitting elements 30 may be the first light-emitting elements 30A, which are located relatively low. The first light-emitting elements 30A may be light-emitting elements 30 that are guided by the height differences generated by the first patterns 70 to have their both ends placed on the electrodes (21 and 22). Some of the light-emitting elements 30, e.g., the second light-emitting elements 30B, may be located relatively high, e.g., on the first patterns 70, and may be electrically connected to the first and second electrodes 21 and 22.

However, the disclosure is not limited to this. As another example, the light-emitting elements 30 may not be arranged on the first patterns 70 depending on the arrangement and the shape of the first patterns 70, and this will be described below.

In each of the light-emitting elements 30, layers may be disposed in a direction perpendicular to the top surface of the first substrate 11 or the first planarization layer 19. The light-emitting elements 30 may be arranged so that the direction in which the light-emitting elements 30 extend may be parallel to the first planarization layer 19, and the semiconductor layers included in each of the light-emitting elements 30 may be sequentially disposed in a direction parallel to the top surface of the first planarization layer 19. However, the disclosure is not limited to this. As another example, the semiconductor layers included in each of the light-emitting elements 30 may be disposed in the direction perpendicular to the first planarization layer 19.

Both ends of each of the light-emitting elements 30 may be in electrical contact with the contact electrodes (26 and 27). For example, an insulating film 38 may not be formed on the ends of each of the light-emitting elements 30 so that some of the semiconductor layers included in each of the light-emitting elements 30 may be exposed and may thus be in electrical contact with the contact electrodes (26 and 27), but the disclosure is not limited thereto. As another example, the insulating film 38 may be removed from at least portions of the light-emitting elements 30 so that sides of the semiconductor layers of each of the light-emitting elements 30 may be partially exposed at both ends of each of the light-emitting elements 30 and may thus be in direct contact with the contact electrodes (26 and 27).

A second insulating layer 52 may be disposed on portions of the light-emitting elements 30. For example, the second insulating layer 52 may be disposed to surround portions of the outer surfaces of the light-emitting elements 30, but not to cover both ends of each of the light-emitting elements 30. The contact electrodes (26 and 27) may be in electrical contact with both ends of each of the light-emitting elements 30, not covered by the second insulating layer 52. In a plan view, portions of the second insulating layer 52 on the light-emitting elements 30 may be disposed to extend in the second direction DR2 on the first insulating layer 51 and thus to form linear or island patterns in the first subpixel PX1. The second insulating layer 52 may protect and fix the light-emitting elements 30 during the fabrication of the display device 10.

Contact electrodes (26 and 27) and a third insulating layer 53 may be disposed on the second insulating layer 52.

The contact electrodes (26 and 27) may extend in one direction. First and second contact electrodes 26 and 27 may be disposed on portions of the first and second electrodes 21 and 22, respectively. The first contact electrode 26 may be disposed on the first electrode 21, the second contact electrode 27 may be disposed on the second electrode 22, and the first and second contact electrodes 26 and 27 may extend in the second direction DR2. The first and second contact electrodes 26 and 27 may be spaced apart from, and face, each other in the first direction DR1 and may form stripe patterns in the emission area EMA of the first subpixel PX1.

In some embodiments, the width of the first and second contact electrodes 27 may be the same as, or smaller than, the width of the first and second electrodes 21 and 22. The first and second contact electrodes 26 and 27 may be disposed to be in electrical contact with both ends of each of the light-emitting elements 30 and to cover portions of the top surfaces of the first and second electrodes 21 and 22.

The contact electrodes (26 and 27) may be in electrical contact with the light-emitting elements 30 and the electrodes (21 and 22). The semiconductor layers included in each of the light-emitting elements 30 may be exposed at both ends of each of the light-emitting elements 30, and the first and second contact electrodes 26 and 27 may be in electrical contact with the light-emitting elements 30 at both ends of each of the light-emitting elements 30 where the semiconductor layers are exposed. The first ends of the light-emitting elements may be electrically connected to the first electrode 21 via the first contact electrode 26, and the second ends of the light-emitting elements 30 may be electrically connected to the second contact electrode 22 via the second contact electrode 27.

One first contact electrode 26 and one second contact electrode 27 are illustrated as being disposed in the first subpixel PX1, but the disclosure is not limited thereto. The numbers of first contact electrodes 26 and second contact electrodes 27 may vary depending on the numbers of first electrodes 21 and second electrodes 22 provided in the first subpixel PX1.

The third insulating layer 53 is disposed on the first contact electrode 26. The third insulating layer 53 may electrically insulate the first and second contact electrodes 26 and 27 from each other. The third insulating layer 53 may be disposed to cover or overlap the first contact electrode 26 but may not be disposed on the second ends of the light-emitting elements 30 so that the light-emitting elements 30 may be in electrical contact with the second contact electrode 27. The third insulating layer 53 may be in partial contact with the first and second contact electrodes 26 and 27 on the top surface of the second insulating layer 52. A side surface of the third insulating layer 53 adjacent to the second electrode 22 or where the second electrode 22 is disposed may be aligned with a corresponding side surface of the second insulating layer 52. The third insulating layer 53 may also be disposed in the non-emission area of the first subpixel PX1, for example, on the first insulating layer 51 on the first planarization layer 19, but the disclosure is not limited thereto.

The second contact electrode 27 is disposed on the second electrode 22, the second insulating layer 52, and the third insulating layer 53. The second contact electrode 27 may be in electrical contact with the second ends of the light-emitting elements 30 and an exposed portion of the top surface of the second electrode 22. The second ends of the light-emitting elements 30 may be electrically connected to the second electrode 22 via the second contact electrode 27.

The second contact electrode 27 may be in partial contact with the second insulating layer 52, the third insulating layer 53, the second electrode 22, and the light-emitting elements 30. The first and second contact electrodes 26 and 27 may not be in contact with the second and third insulating layers 52 and 53, but the disclosure is not limited thereto. In some embodiments, the third insulating layer 53 may not be provided.

The contact electrodes (26 and 27) may include a conductive material. The contact electrodes (26 and 27) may include ITO, IZO, ITZO, or Al. For example, the contact electrodes (26 and 27) may include a transparent conductive material, and light emitted from the light-emitting elements 30 may travel toward the electrodes (26 and 27) through the contact electrodes (26 and 27). However, the disclosure is not limited to this.

A fourth insulating layer 54 may be disposed on the entire surface of the first substrate 11. The fourth insulating layer 54 may protect elements disposed on the first substrate 11 from an external environment.

The first, second, third, and fourth insulating layers 51, 52, 53, and 54 may include an inorganic insulating material or an organic insulating material. For example, the first, second, third, and fourth insulating layers 51, 52, 53, and 54 may include an inorganic insulating material such as $SiO_x$, $SiN_x$, silicon oxynitride ($SiO_xN_y$), aluminum oxide ($Al_2O_3$), or aluminum nitride (AlN). In another example, the first, second, third, and fourth insulating layers 51, 52, 53, and 54 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited to these examples.

Figure 6:
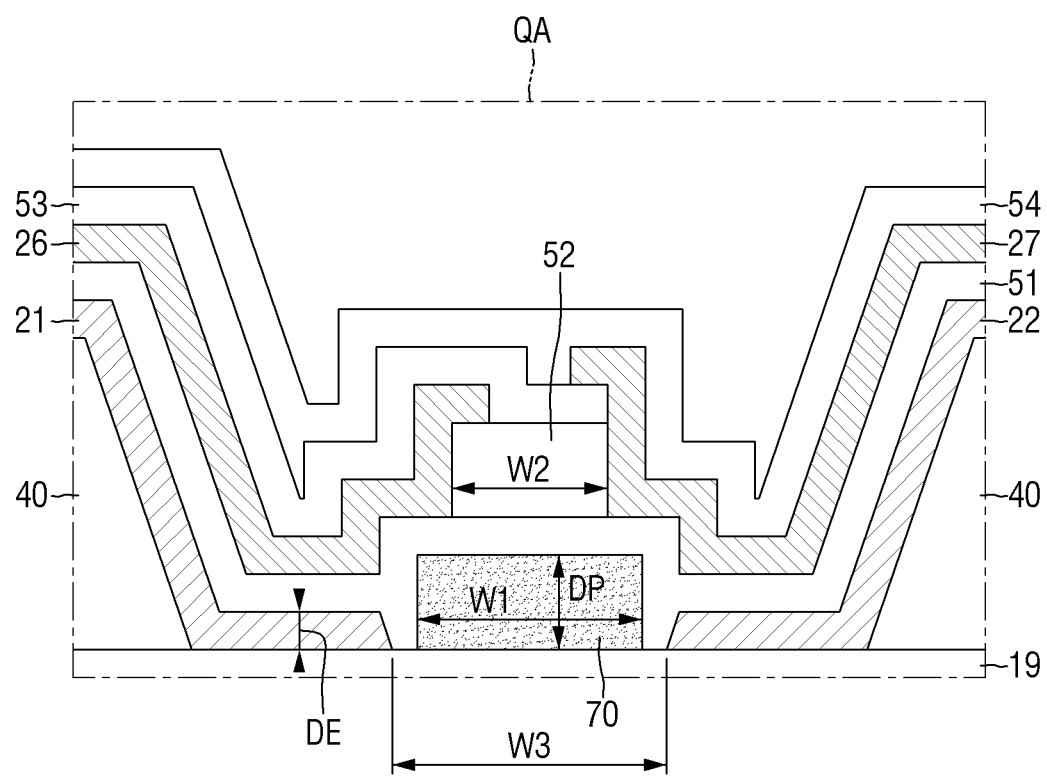
FIG. 6 is a schematic enlarged cross-sectional view of portion QA of FIG. 4.
Figure 7:
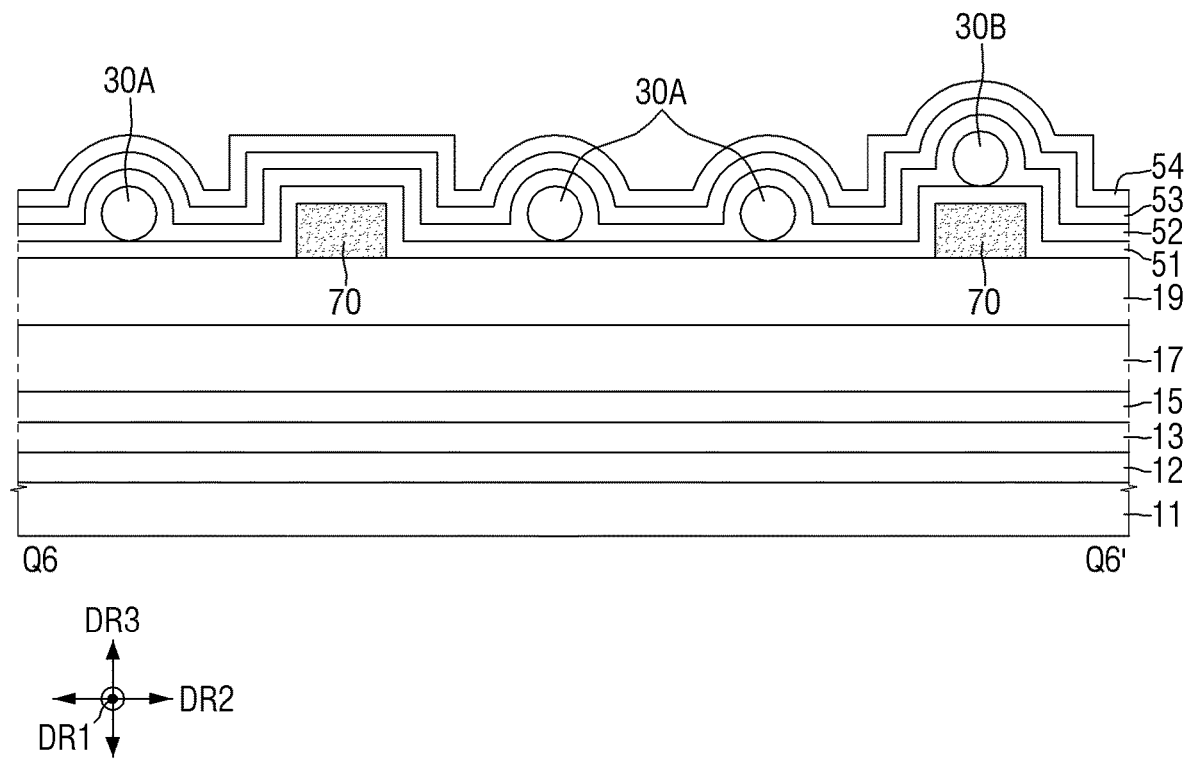
FIG. 7 is a schematic cross-sectional view taken along line Q6-Q6' of FIG. 2.

FIG. 6 is an enlarged schematic cross-sectional view of portion QA of FIG. 4. FIG. 7 is a schematic cross-sectional view taken along line Q6-Q6' of FIG. 2. Specifically, FIG. 6 illustrates an enlarged schematic cross-sectional view of portions where the first patterns 70 of FIG. 4 are disposed, and FIG. 7 illustrates a schematic cross-sectional view of light-emitting elements 30 arranged in the second direction DR2 together with first patterns 70 between the first banks 40.

Referring to FIGS. 6 and 7 and further to FIGS. 3 through 5, the first patterns 70 may be disposed between the first banks 40 to be spaced apart from one another in the second direction DR2. The first insulating layer 51, which covers the first patterns 70, is disposed to conform to the height differences generated by the first patterns 70, which are disposed below the first insulating layer 51, between the first banks 40. During the fabrication of the display device 10, ink including the light-emitting elements 30 may be sprayed into the first subpixel PX1 after the formation of the first insulating layer 51 and the second bank 45. The light-emitting elements 30 may be sprayed onto the electrodes (21 and 22) while being scattered in the ink, and as the positions and the alignment direction of the light-emitting elements 30 change due to an electric field formed on the electrodes (21 and 22), the light-emitting elements 30 may be arranged so that both ends thereof may be placed on the electrodes (21 and 22).

The light-emitting elements 30, scattered in the ink, may be randomly placed within the emission area EMA surrounded by the second bank 45 or may be placed even in regions other than regions between the first banks 40. Light-emitting elements 30 placed in the regions other than regions between the first banks 40 may not be electrically connected to the electrodes (21 and 22) and may be lost during the fabrication of the display device 10. If the light-emitting element loss rate is high, the process yield may decrease because of the need to spray a considerable amount of ink to maintain a predetermined number of light-emitting elements 30 in each subpixel PXn.

Since the top surfaces of the first banks 40 protrude from the first planarization layer 19, the emission area EMA can be properly defined, and a considerable amount of light-emitting elements 30 can be guided to be placed within the space defined by the first banks 40. Similarly, since the top surfaces of the first patterns 70 are elevated from the first planarization layer 19, the region between the first banks 40 can be properly divided. The first insulating layer 51 can be located higher on the first patterns 70 than between the first patterns 70, and the light-emitting elements 30, scattered in the ink, can be guided into the regions where the first patterns 70 are spaced apart from one another, in case that their positions change due to the electric field. For example, as illustrated in FIGS. 6 and 7, the first insulating layer 51 may be lower between the first patterns 70 than on the first patterns 70 with respect to the top surface of the first substrate 11 or the first planarization layer 19. Some of the light-emitting elements 30, scattered in the ink, may be guided to be disposed on portions of the first insulating layer 51 that are located relatively low.

The first patterns 70, like the first banks 40, can guide the light-emitting elements 30 to be placed at particular locations in the emission area EMA, and as a result, a considerable number of light-emitting elements 30 can be arranged between the first banks 40. Accordingly, the number of light-emitting elements 30 that may be lost during the fabrication of the display device 10 can be reduced, and the light-emitting elements 30 can be arranged so that both ends thereof can be placed on the electrodes (21 and 22), between the first banks 40. As a result, any contact defects between the contact electrodes (26 and 27) and the light-emitting elements 30 can be prevented.

The light-emitting elements 30 may include first light-emitting elements 30A that are disposed not to overlap the first patterns 70 in the thickness direction, and the first light-emitting elements 30A may be arranged so that both ends thereof may be placed on the first and second electrodes 21 and 22. The first light-emitting elements 30A may be aligned so that both ends thereof may be placed at desired locations. However, even if the light-emitting elements 30 are disposed on the first patterns 70, the light-emitting elements 30 can be electrically connected to the electrodes (21 and 22) as long as both ends thereof can be properly in electrical contact with the contact electrodes (26 and 27).

The light-emitting elements 30 may further include second light-emitting elements 30B that are disposed to overlap the first patterns 70 in the thickness direction. Most of the light-emitting elements 30, i.e., the first light-emitting elements 30A, may be disposed not to overlap the first patterns 70, but at least some of the light-emitting elements 30 may be disposed on the first patterns 70 to be in electrical contact with the contact electrodes (26 and 27). The second light-emitting elements 30B may be disposed on the first patterns 70 to be located higher than the first light-emitting elements 30A. The first light-emitting elements 30A may be located lower than the second light-emitting elements 30B with respect to the top surface of the first substrate 11 or the first planarization layer 19. The height difference between the first light-emitting elements 30A and the second light-emitting elements 30B may vary depending on the thickness of the first patterns 70.

The first patterns 70 may be thick enough to guide the light-emitting elements 30 to be arranged therebetween by the height differences generated between the first banks 40 by the first insulating layer 51. A thickness DP of the first patterns 70 may be greater than a thickness DE of the electrodes (21 and 22). The first insulating layer 51 may generate height differences between the first banks 40 with respect to the top surface of the first planarization layer 19 due to the presence of the electrodes (21 and 22). Portions of the first insulating layer 51 that cover the first and second electrodes 21 and 22 may be located higher than portions of the first insulating layer 51 that are disposed on the top surface of the first planarization layer 19. As the thickness DP of the first patterns 70 is greater than the thickness DE of the electrodes (21 and 22), portions of the first insulating layer 51 that are disposed on the first patterns 70 may be located higher than the portions of the first insulating layer 51 that are disposed on the first planarization layer 19 or the electrodes (21 and 22). The first patterns 70 can generate significant height differences between the first banks 40, and as a result, the light-emitting elements 30 can be guided to be placed at particular locations.

For example, a width W1 of the first patterns 70 may be smaller than a distance W3 between the first and second electrodes 21 and 22, and the first patterns 70 may be disposed between the first and second electrodes 21 and 22. The electrodes (21 and 22) may be disposed to be spaced apart from both side surfaces of each of the first patterns 70, and height differences generated between the electrodes (21 and 22) can effectively guide the light-emitting elements 30 to be placed at particular locations.

The width W1 of the first patterns 70 may be greater than a width W2 of the second insulating layer 52. The second insulating layer 52 may be disposed to surround portions of the outer surfaces of the light-emitting elements 30 and thus to fix the light-emitting elements 30. The width W2 of the second insulating layer 52 may be smaller than a length h of the light-emitting elements 30 so that both ends of each of the light-emitting elements 30 may be exposed to be in electrical contact with the contact electrodes (26 and 27). The first patterns 70 may have such a predetermined width that even the second light-emitting elements 30B may be placed parallel to the top surface of the first planarization layer 19. If the width W1 of the first patterns 70 is too small, the first insulating layer 51, which is disposed on the first patterns 70, may not be able to provide sufficient space for the arrangement of the second light-emitting elements 30B, and the second light-emitting elements 30B may be slantingly arranged. The first patterns 70 may be formed to have a greater width than the second insulating layer 52 and may provide sufficient space for the arrangement of the second light-emitting elements 30B thereon.

However, the width W1 and the thickness DP of the first patterns 70 are not particularly limited. As another example, the width W1 of the first patterns 70 may be identical to or greater than the distance W3 between the first and second electrodes 21 and 22 and may be even greater than the length h of the light-emitting elements 30. The first patterns 70 and the first banks 40 may be formed at the same time, or the first patterns 70 may be formed by a separate patterning after the formation of the first banks 40. In some embodiments, the first patterns 70 may be integrally formed with the first planarization layer 19, which is disposed below the first patterns 70.

The display device 10 may include first patterns 70 that are arranged in one direction between the first banks 40. During the fabrication of the display device 10, most of the light-emitting elements 30 can be guided to be aligned at particular locations, and the number of light-emitting elements 30 that may be lost from each subpixel PXn can be minimized.

Figure 8:
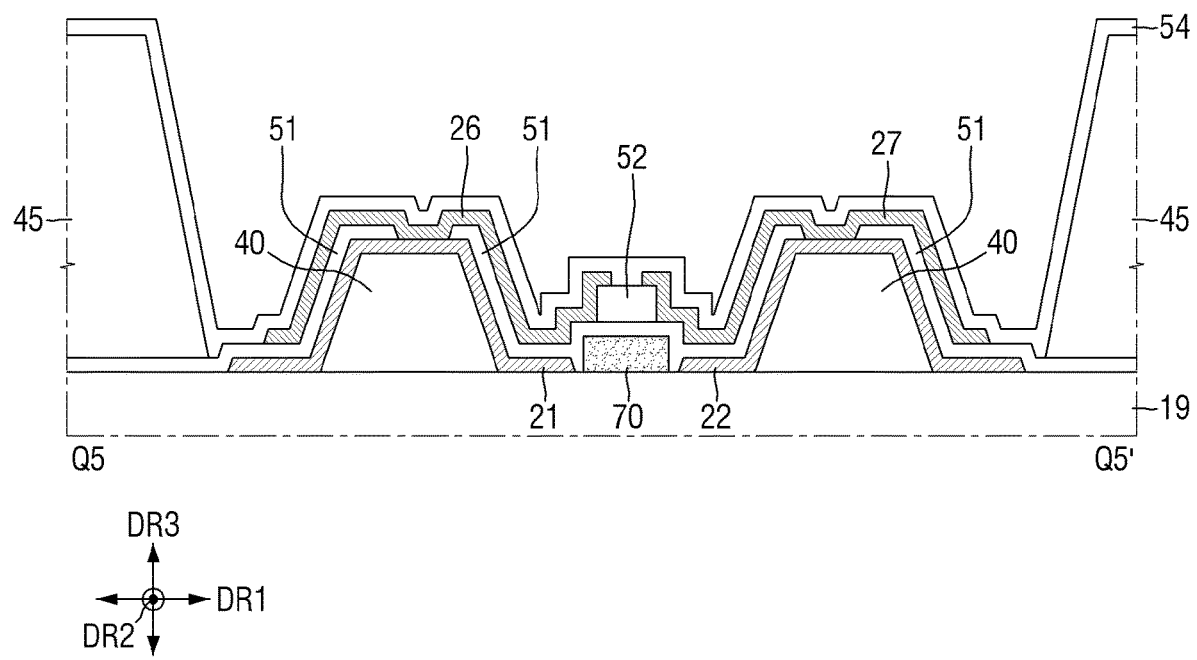
FIG. 8 is a schematic partial cross-sectional view of a display device according to another embodiment of the disclosure.

FIG. 8 is a schematic partial cross-sectional view of a display device according to another embodiment of the disclosure. FIG. 8, similar to FIG. 4, illustrates a schematic cross-sectional view of first patterns 70 with no light-emitting elements 30 disposed thereon.

Referring to FIG. 8, a display device 10 may not include the third insulating layer 53 of FIG. 4. A second contact electrode 27 may be disposed directly on portion of a second insulating layer 52, and first and second contact electrodes 26 and 27 may be spaced apart from each other over the second insulating layer 52. Even though the display device 10 does not include the third insulating layer 53, the second insulating layer 52 includes an organic insulating material and may fix a light-emitting element 30. The first and second contact electrodes 26 and 27 may be formed at the same time by a patterning process. The embodiment of FIG. 8 is almost the same as the embodiment of FIG. 4 except that the third insulating layer 53 is not provided, and thus, a detailed description thereof will be omitted.

Figure 9:
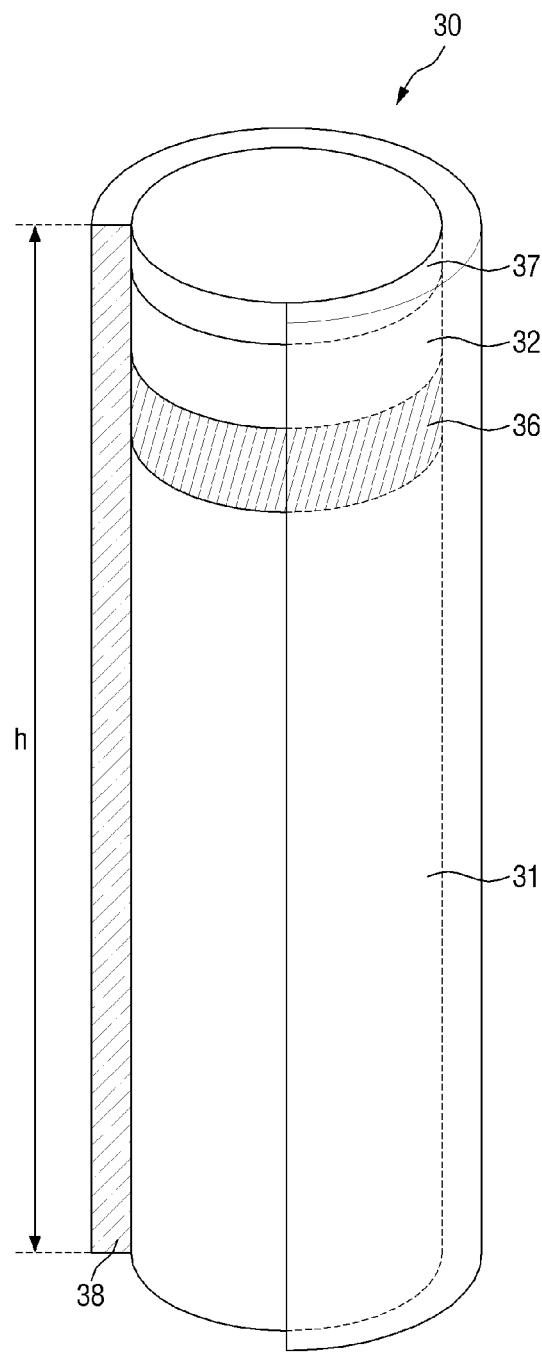
FIG. 9 is a schematic perspective view of a light-emitting element according to an embodiment of the disclosure.

FIG. 9 is a schematic perspective view of a light-emitting element according to an embodiment of the disclosure.

Referring to FIG. 9, a light-emitting element 30 may be a light-emitting diode (LED), particularly, an ILED having a size of several micrometers or nanometers and formed of an inorganic material. If an electric field is formed in a particular direction between two opposite electrodes, the ILED may be aligned between the two electrodes where polarities are formed. The light-emitting element 30 may be aligned by the electric field formed between the two electrodes.

The light-emitting element 30 may have a shape that extends in one direction. The light-emitting element 30 may have the shape of a rod, a wire, or a tube. For example, the light-emitting element 30 may have a cylindrical or rod shape, but the disclosure is not limited thereto. In another example, the light-emitting element 30 may have the shape of a polygonal column such as a regular cube, a rectangular parallelepiped, or a hexagonal column or may have a shape that extends in one direction and has a partially inclined outer surface. Semiconductors included in the light-emitting element 30 may be sequentially disposed or stacked in the direction in which the light-emitting element 30 extends.

The light-emitting element 30 may include semiconductor layers doped with impurities of an arbitrary conductivity type (e.g., a p-type or an n-type). The semiconductor layers may receive electrical signals from an external power source to emit light of a particular wavelength range.

Referring to FIG. 9, the light-emitting element 30 may include a first semiconductor layer 31, a second semiconductor layer 32, a light-emitting layer 36, an electrode layer 37, and an insulating film 38.

The first semiconductor layer 31 may include an n-type semiconductor. For example, in a case where the light-emitting element 30 emits light of a blue wavelength range, the first semiconductor layer 31 may include a semiconductor material $Al_xGa_yIn_{1-x-y}N$ (where $0 \le x \le 1$, $0 \le y \le 1$, and $0 \le x+y \le 1$). For example, the semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with an n-type dopant, and the n-type dopant may be, for example, Si, Ge, or Sn. For example, the first semiconductor layer 31 may be n-GaN doped with n-type Si. The first semiconductor layer 31 may have a length of about 1.5 µm to about 5 µm, but the disclosure is not limited thereto.

The second semiconductor layer 32 is disposed on the light-emitting layer 36. The second semiconductor layer 32 may include a p-type semiconductor. For example, in a case where the light-emitting element 30 emits light of a blue or green wavelength range, the second semiconductor layer 32 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with a p-type dopant. The second semiconductor layer 32 may be doped with a p-type dopant, and the p-type dopant may be, for example, Mg, Zn, Ca, Se, or Ba. For example, the second semiconductor layer 32 may be p-GaN doped with p-type Mg. The second semiconductor layer 32 may have a length of about 0.05 µm to about 0.10 µm, but the disclosure is not limited thereto.

The first and second semiconductor layers 31 and 32 are illustrated as being formed as single-layer films, but the disclosure is not limited thereto. As another example, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 is disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. For example, in a case where the light-emitting layer 36 emits light of a blue wavelength range, the quantum layers may include a material such as AlGaN or AlGaInN. In particular, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. In a case where the light-emitting layer 36 includes AlGaInN as its quantum layer(s) and AlInN as its well layer(s), the light-emitting layer 36 can emit blue light having a central wavelength range of about 450 nm to about 495 nm.

However, the disclosure is not limited to this. As another example, the light-emitting layer 36 may have a structure in which a semiconductor material having a large band gap energy and a semiconductor material having a small band gap energy are alternately stacked or may include group III or group V semiconductor materials depending on the wavelength of light to be emitted. The type of light emitted by the light-emitting layer 36 is not particularly limited. The light-emitting layer 36 may emit light of a red or green wavelength range as necessary, instead of blue light. The light-emitting layer 36 may have a length of about 0.05 µm to about 0.10 µm, but the disclosure is not limited thereto.

Light may be emitted not only from the circumferential surface, in a length direction, of the light-emitting element 30, but also from both sides of the light-emitting element 30. The directionality of the light emitted from the light-emitting layer 36 is not particularly limited.

The electrode layer 37 may be an ohmic contact electrode, but the disclosure is not limited thereto. As another example, the electrode layer 37 may be a Schottky contact electrode. The light-emitting element 30 may include at least one electrode layer 37. FIG. 9 illustrates that the light-emitting element 30 includes one electrode layer 37, but the disclosure is not limited thereto. As another example, the light-emitting element 30 may include more than one electrode layer 37, or the electrode layer 37 may not be provided. However, the following description of the light-emitting element 30 may be directly applicable to a light-emitting element 30 having more than one electrode layer 37 or having a different structure from the light-emitting element 30 of FIG. 9.

The electrode layer 37 may reduce the resistance between the light-emitting element 30 and electrodes (or contact electrodes) in case that the light-emitting element 30 is electrically connected to the electrodes (or the contact electrodes). The electrode layer 37 may include a conductive metal. For example, the electrode layer 37 may include at least one of Al, Ti, In, Au, Ag, ITO, IZO, and ITZO. Also, the electrode layer 37 may include a semiconductor material doped with an n- or p-type dopant. The electrode layer 37 may include the same material or different materials, but the disclosure is not limited thereto.

The insulating film 38 is disposed to surround the first and second semiconductor layers 31 and 32 and the electrode layer 37. For example, the insulating film 38 may be disposed to surround at least the light-emitting layer 36 and may extend in the direction in which the light-emitting element 30 extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, but to expose both ends, in the length direction, of the light-emitting element 30.

The insulating film 38 is illustrated as being formed to extend in the length direction of the light-emitting element 30 and to cover the sides of the first semiconductor layer 31, the light-emitting layer 36, the second semiconductor layer 32, and the electrode layer 37, but the disclosure is not limited thereto. The insulating film 38 may cover the sides of only the light-emitting layer 36 and some of the first and second semiconductor layers 31 and 32 or may cover only portion of the side of the electrode layer 37 so that the side of the electrode layer 37 may be partially exposed. The insulating film 38 may be formed to be rounded in a cross-sectional view, in a region adjacent to at least one end of the light-emitting element 30.

The insulating film 38 may have a thickness of about 10 nm to about 1.0 µm, but the disclosure is not limited thereto. The insulating film 38 may have a thickness of about 40 nm.

The insulating film 38 may include a material with insulating properties such as, for example, $SiO_x$, $SiN_x$, $SiO_xN_y$, AlN, or $Al_2O_3$. Accordingly, the insulating film 38 can prevent any short circuit that may occur in case that the light-emitting layer 36 is placed in direct contact with electrodes that transmit electrical signals directly to the light-emitting element 30. Since the insulating film 38 includes the light-emitting layer 36 to protect the outer surface of the light-emitting element 30, any degradation in the emission efficiency of the light-emitting element 30 can be prevented.

In some embodiments, the outer surface of the insulating film 38 may be subjected to surface treatment. The light-emitting element 30 may be sprayed on electrodes while being scattered in predetermined ink. Here, the surface of the insulating film 38 may be hydrophobically or hydrophilically treated to keep the light-emitting element 30 scattered in ink without agglomerating with other neighboring light-emitting elements 30.

A length h of the light-emitting element 30 may be in the range of about 1 urn to about 10 μm, about 2 μm to about 6 μm, or about 3 μm to about 5 μm. The light-emitting element 30 may have a diameter of about 30 nm to about 700 nm and may have an aspect ratio of 1.2 to 100, but the disclosure is not limited thereto. Different light-emitting elements 30 included in the display device 10 may have different diameters depending on the composition of their respective light-emitting layers 36. For example, the light-emitting element 30 may have a diameter of about 500 nm.

A method of fabricating the display device 10 will hereinafter be described.

Figure 10:
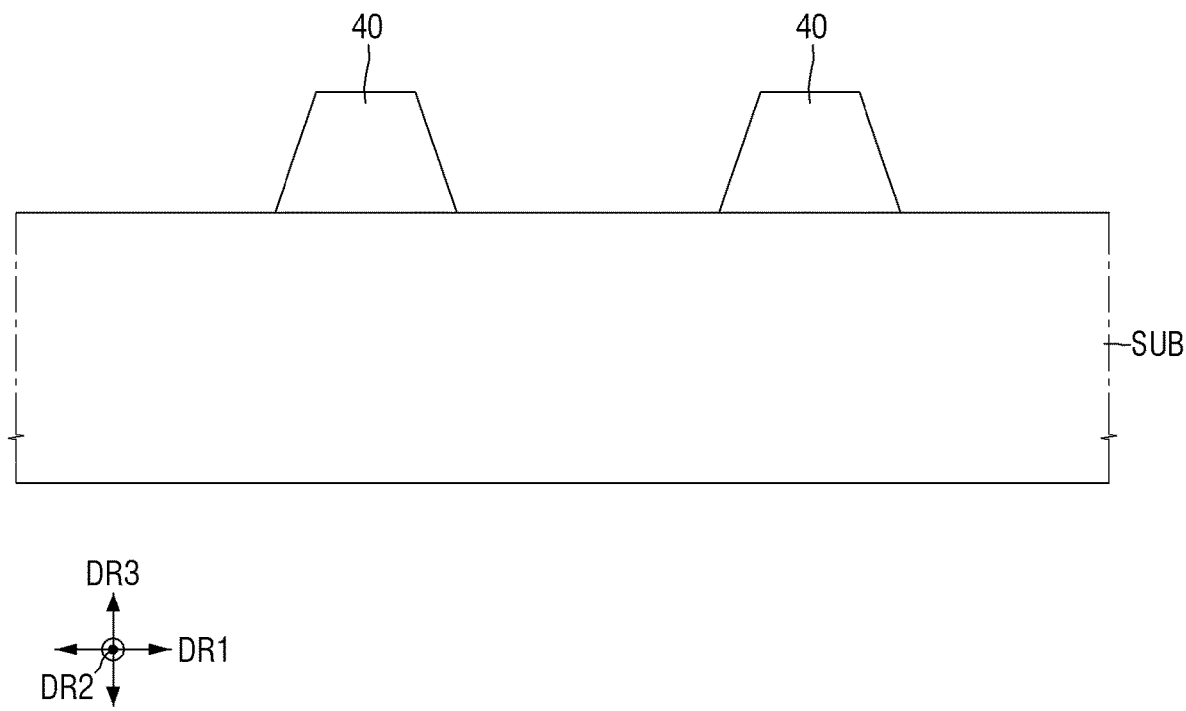
FIGS. 10 through 12 are schematic cross-sectional views illustrating processes of a method of fabricating a display device according to an embodiment of the disclosure.
Figure 11:
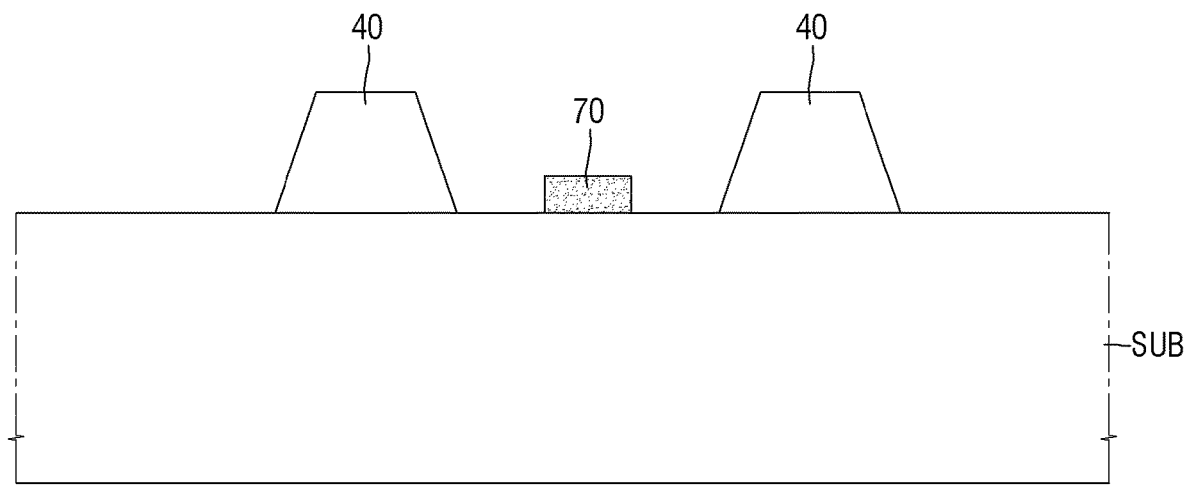
Figure 11:
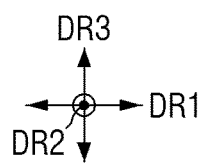
Figure 12:
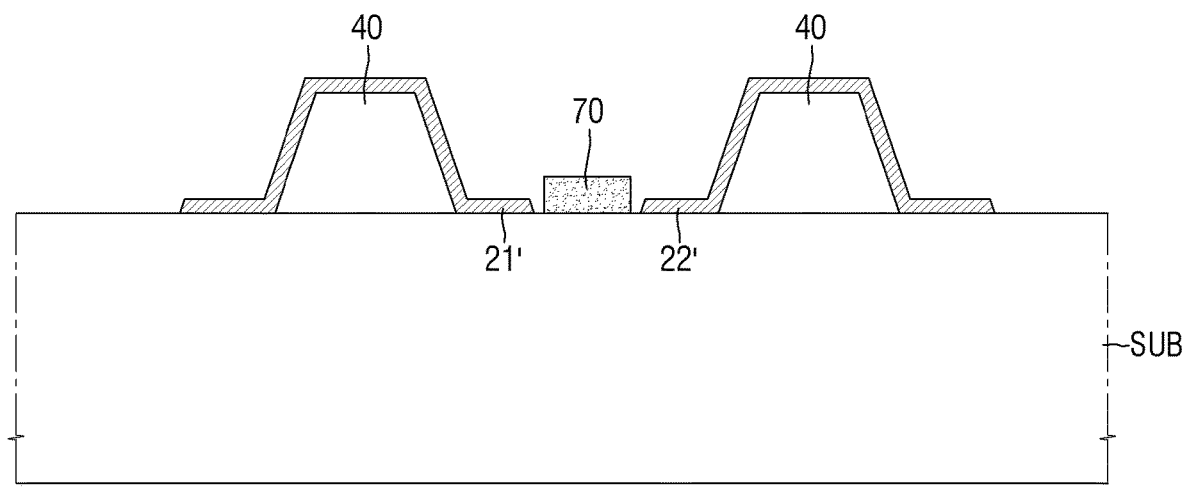
Figure 12:
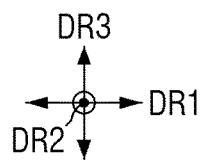
Figure 13:
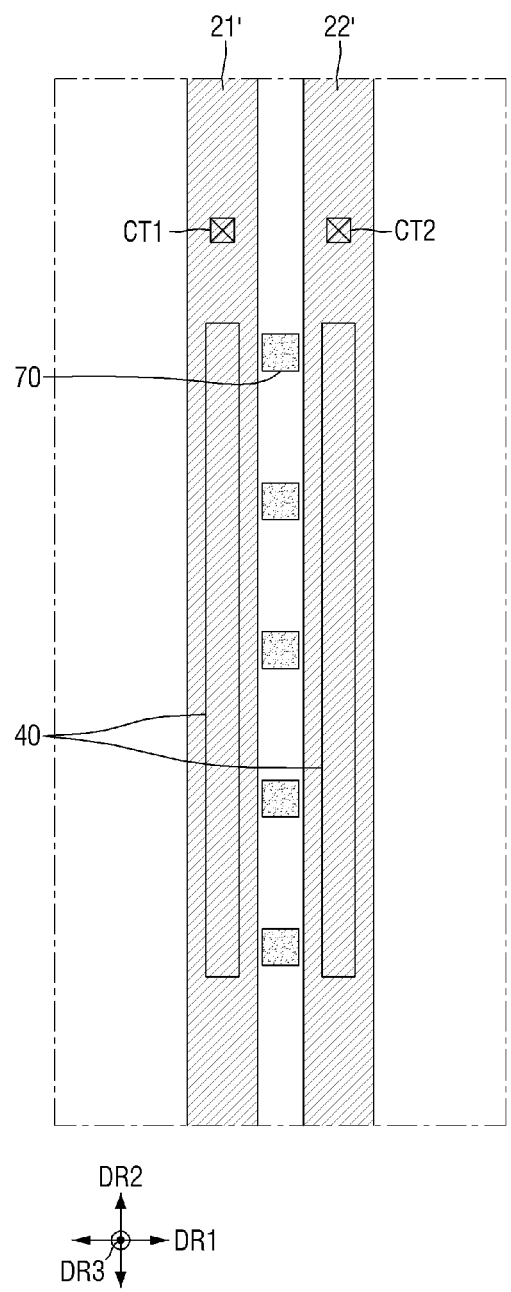
FIG. 13 is a schematic plan view of a subpixel obtained by the processes illustrated in FIG. 12.

FIGS. 10 through 12 are schematic cross-sectional views illustrating processes of a method of fabricating a display device according to an embodiment of the disclosure. FIG. 13 is a schematic plan view of a subpixel obtained by the process(es) illustrated in FIG. 12.

Referring first to FIG. 10, a target substrate SUB where a first insulating layer 51 and electrodes (21 and 22) are disposed is prepared. Although not specifically illustrated, the target substrate SUB may include a first substrate 11 and may further include circuit elements that include conductive layers and insulating layers. For convenience, the first substrate 11 and the circuit elements will hereinafter be collectively referred to as the target substrate SUB.

Thereafter, first banks 40 are formed on the target substrate SUB to be spaced apart from each other. As already mentioned above, the first banks 40 may protrude from the top surface of the target substrate SUB.

Thereafter, referring to FIG. 11, first patterns 70 are formed between the first banks 40, on the target substrate SUB. The first patterns 70 may be spaced apart from the first banks 40 and may have a smaller thickness than the first banks 40. The first patterns 70 are illustrated as being formed after the formation of the first banks 40, but the disclosure is not limited thereto. As another example, the first patterns 70 and the first banks 40 may include the same materials and may be formed at the same time. For example, the first banks 40 and the first patterns 70, which have a different thickness from the first banks 40, may be formed at the same time using a halftone mask during the formation of the first banks 40.

Thereafter, referring to FIGS. 12 and 13, first and second electrode layers 21' and 22' are formed on the first banks 40. The first and second electrode layers 21' and 22' extend in a second direction DR2 and are spaced apart from each other with the first patterns 70 therebetween. The first and second electrode layers 21' and 22' may extend in the second direction DR2 to be disposed in other subpixels PXn during the fabrication of a display device 10. The first and second electrode layers 21' and 22' may be cut in a cut area CBA of each subpixel PXn after the arrangement of light-emitting elements 30 and may then be formed into first and second electrodes 21 and 22, respectively.

The first patterns 70 may be arranged between the first banks 40 or between the first and second electrode layers 21' and 22' to be spaced apart from one another in the second direction DR2. The region between the first banks 40 may be divided into regions where the first patterns 70 are disposed and regions where the first patterns 70 are not disposed, and the regions where the first patterns 70 are disposed may have a different height from the regions where the first patterns 70 are not disposed. Thereafter, a first insulating layer 51, which covers the first patterns 70 and the first and second electrode layers 21' and 22', and a second bank 45, which is disposed on the first insulating layer 51, are formed, and the light-emitting elements 30 are disposed between the first banks 40.

Figure 14:
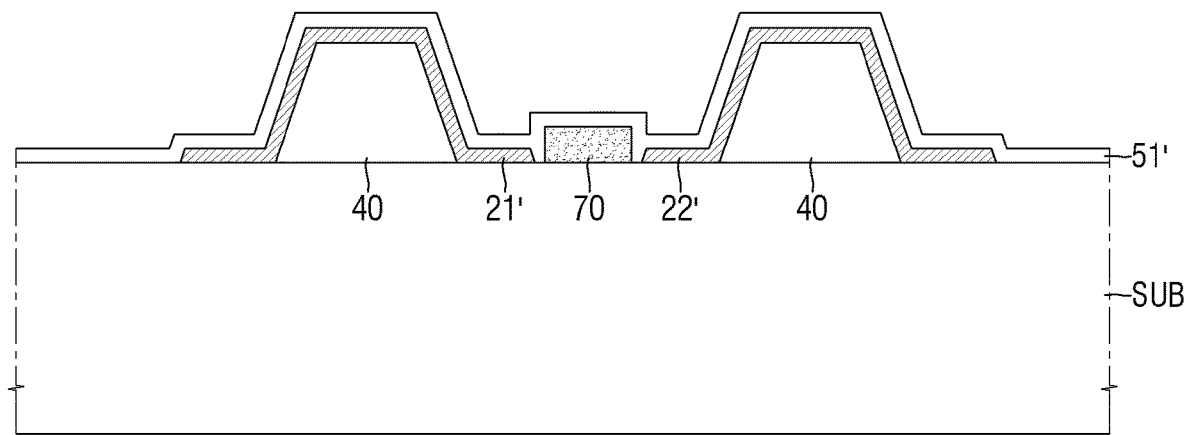
FIGS. 14 and 15 are schematic cross-sectional views illustrating processes of the method of fabricating a display device according to an embodiment of the disclosure.
Figure 15:
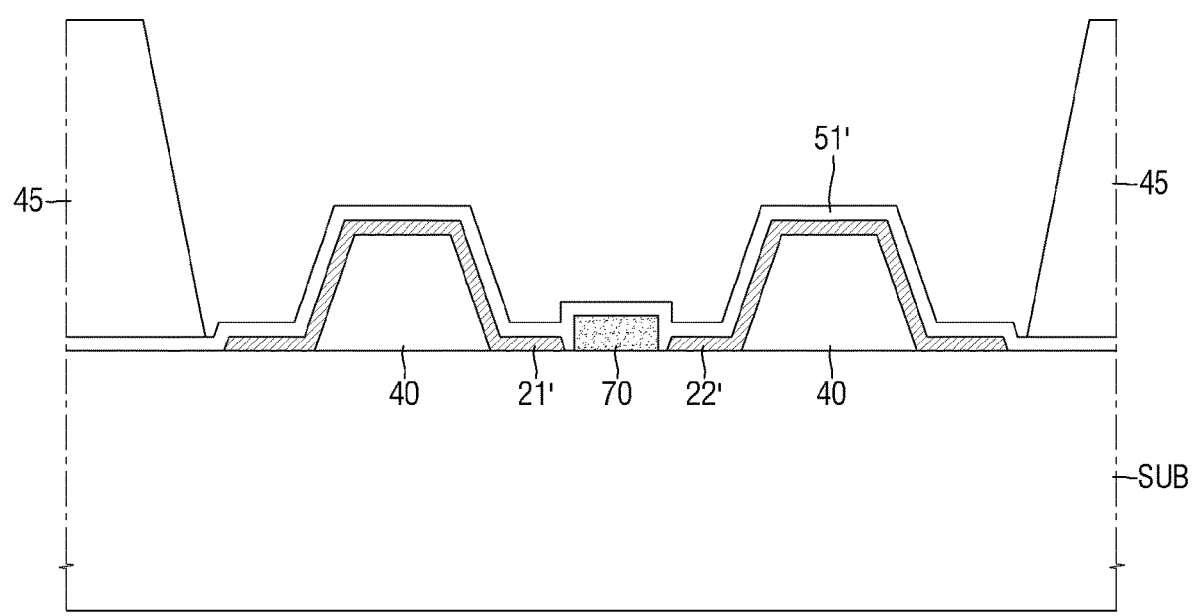
Figure 15:
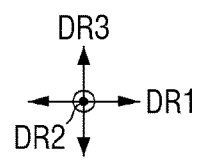

FIGS. 14 and 15 are schematic cross-sectional views illustrating processes of the method of fabricating a display device according to an embodiment of the disclosure.

Referring to FIGS. 14 and 15, a first insulating material layer 51', which covers the first patterns 70 and electrode layers (21' and 22'), is formed, and the second bank 45, which is disposed on the first insulating material layer 51' and surrounds an emission area EMA and the cut area CBA of each subpixel PXn, is formed. The first insulating material layer 51' may be disposed on the entire surface of the target substrate SUB and may cover the first patterns 70 and the electrode layers (21' and 22'). The first insulating material layer 51' may be partially removed in a subsequent process so that the top surfaces of the electrode layers (21' and 22') may be exposed, and as a result, the first insulating layer 51 may be formed. As already mentioned above, the second bank 45 may be disposed to surround and separate each subpixel PXn and may also separate the emission area EMA and the cut area CBA of each subpixel PXn.

Figure 16:
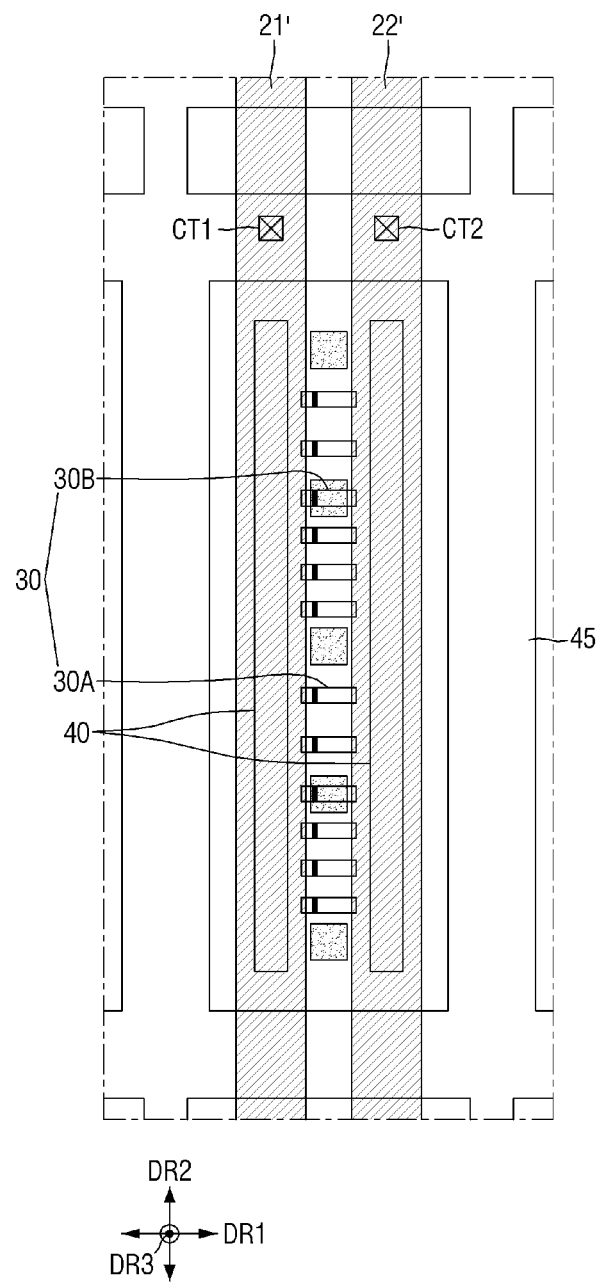
FIG. 16 is a schematic plan view of a subpixel obtained by the processes illustrated in FIGS. 14 and 15.
Figure 17:
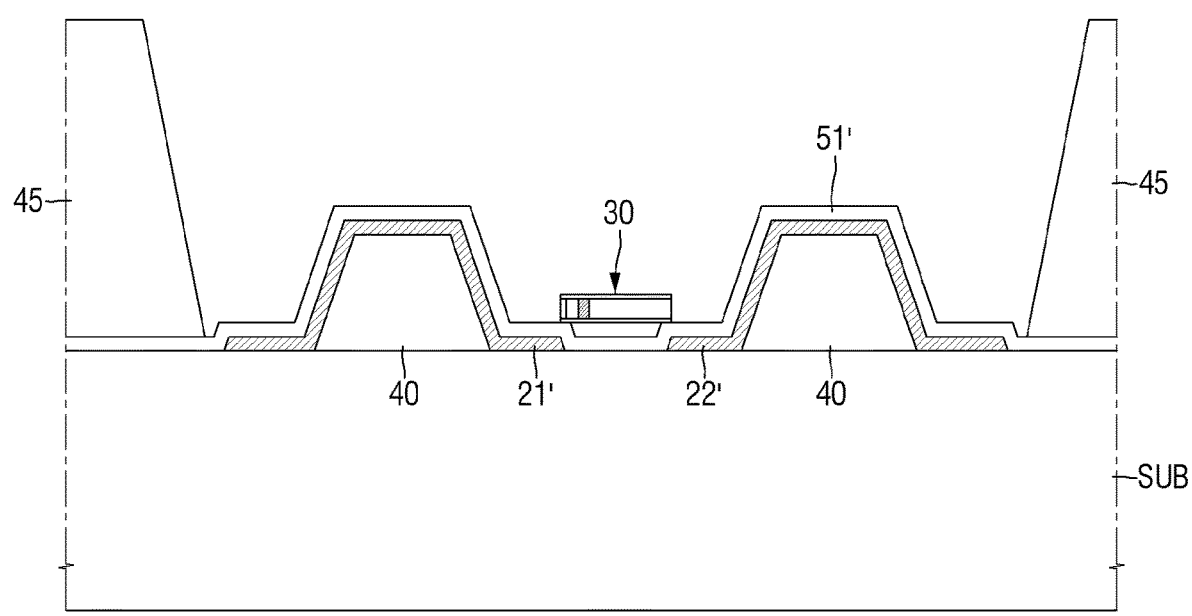
FIGS. 17 through 19 are schematic cross-sectional views illustrating the arrangement of light-emitting elements and first patterns in the subpixel of FIG. 16.
Figure 18:
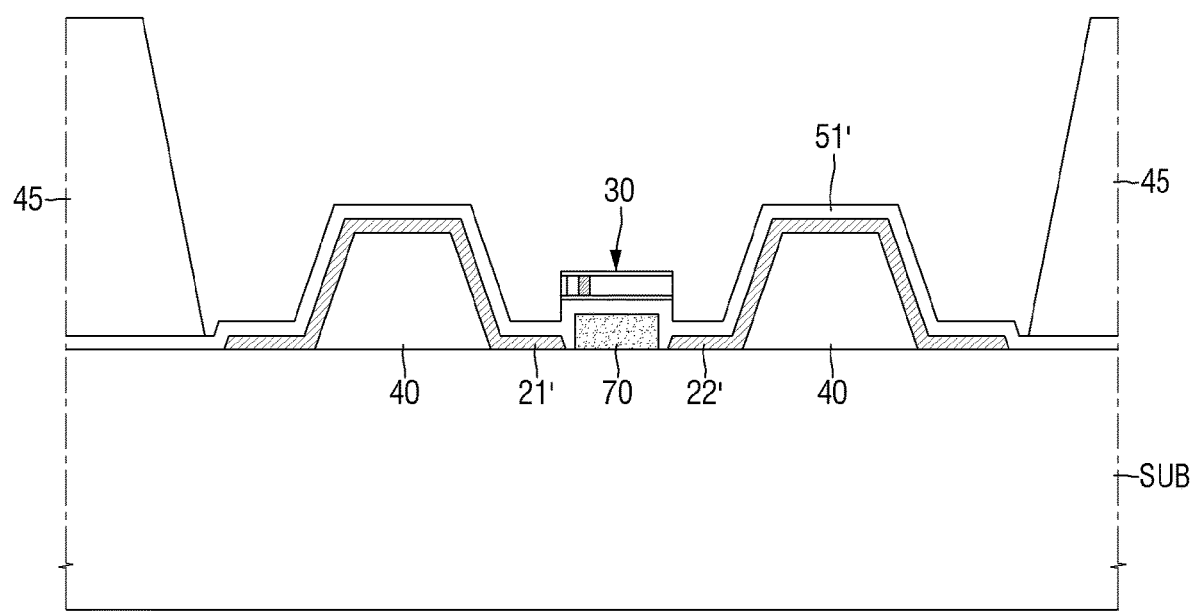
Figure 18:
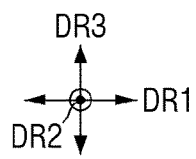
Figure 19:
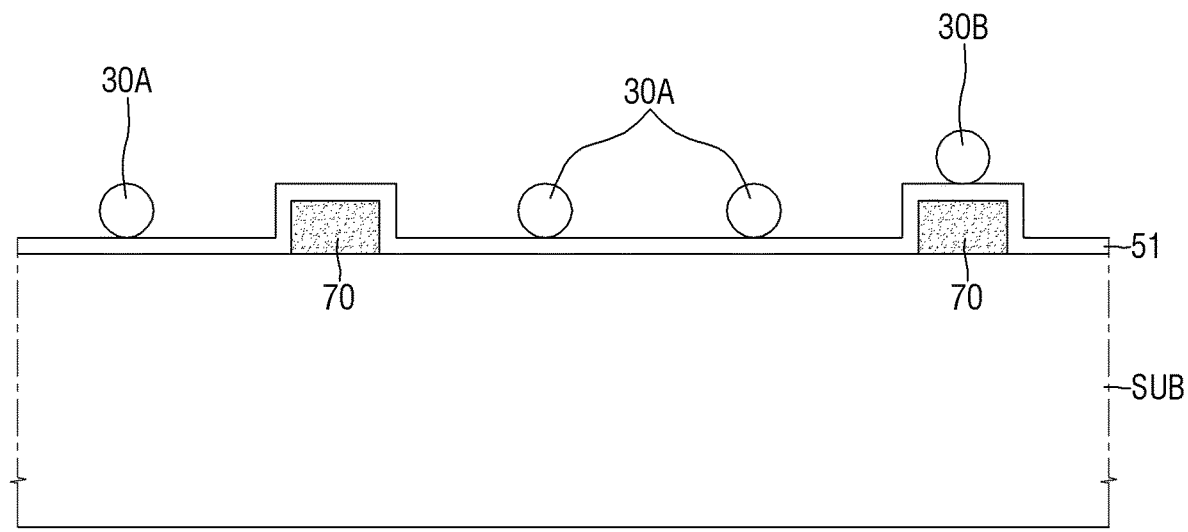

FIG. 16 is a schematic plan view of a subpixel obtained by the processes illustrated in FIGS. 14 and 15. FIGS. 17 through 19 are schematic cross-sectional views illustrating the arrangement of light-emitting elements and first patterns in the subpixel of FIG. 16. Specifically, FIG. 17 illustrates light-emitting elements 30 disposed in regions where first patterns 70 are not disposed, and FIG. 18 illustrates light-emitting elements 30 disposed in regions where the first patterns 70 are disposed. FIG. 19 illustrates light-emitting elements 30 disposed between the first patterns 70, which are spaced apart from each other in the second direction DR2.

Referring to FIGS. 16 through 19, light-emitting elements 30 are disposed between the first banks 40. The light-emitting elements 30 may be disposed so that both ends thereof may be placed on the first and second electrode layers 21' and 22'. The light-emitting elements 30 may be sprayed onto the target substrate SUB while being scattered in ink. For example, the light-emitting elements 30 may be prepared to be scattered in ink and may then be sprayed onto the target substrate SUB by a printing process using an inkjet printing device. The ink sprayed by the inkjet printing device may be settled within each region surrounded by the second bank 45. The second bank 45 may prevent the ink from spilling over between different pixels PXn.

Once the ink including the light-emitting elements 30 is sprayed, the light-emitting elements 30 may be arranged on the first insulating material layer 51' by applying electrical signals to the electrode layers (21' and 22'). As the electrical signals are applied to the electrode layers (21' and 22'), an electric field may be generated between the electrode layers (21' and 22'). The light-emitting elements 30 scattered in the ink may receive a dielectrophoretic force from the electric field, and as a result, the alignment direction and the positions of the light-emitting elements 30 may change so that the light-emitting elements 30 may be settled on the first insulating material layer 51'. Here, some of the light-emitting elements 30, i.e., light-emitting elements 30A, may be disposed between the first patterns 70, as illustrated in FIG. 17, and some of the light-emitting elements 30, e.g., light-emitting elements 30B, may be disposed on the first patterns 70, as illustrated in FIG. 18. Also, some of the first patterns 70 may have no light-emitting elements 30 disposed thereon. The first patterns 70 may guide the light-emitting elements 30 to be placed so that each of both ends of each of the light-emitting elements 30 may be arranged on corresponding one of electrodes (21 and 22) or on the electrode layers (21' and 22'), and most of the light-emitting elements 30 may be arranged at locations relatively lower than the first patterns 70. However, as illustrated in FIG. 5, at least some of the light-emitting element 30 may be disposed on the first patterns 70, and even these light-emitting elements 30 may be electrically connected to the electrodes (21 and 22) via contact electrodes (26 and 27).

Figure 20:
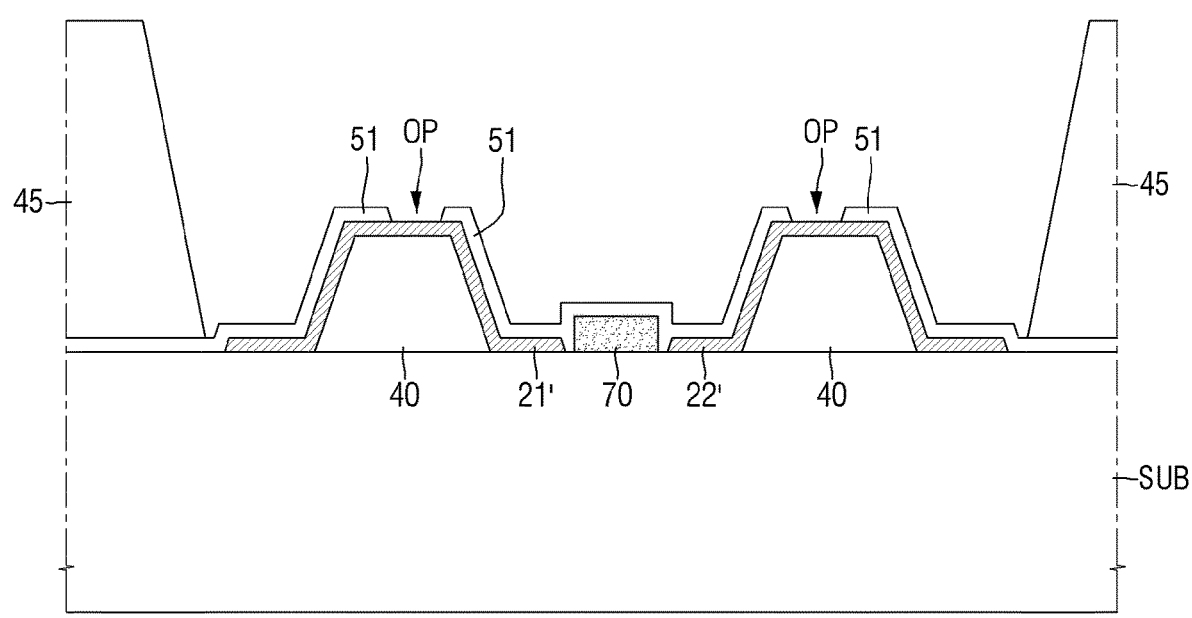
FIGS. 20 and 21 are schematic cross-sectional views illustrating processes of the method of fabricating a display device according to an embodiment of the disclosure.
Figure 21:
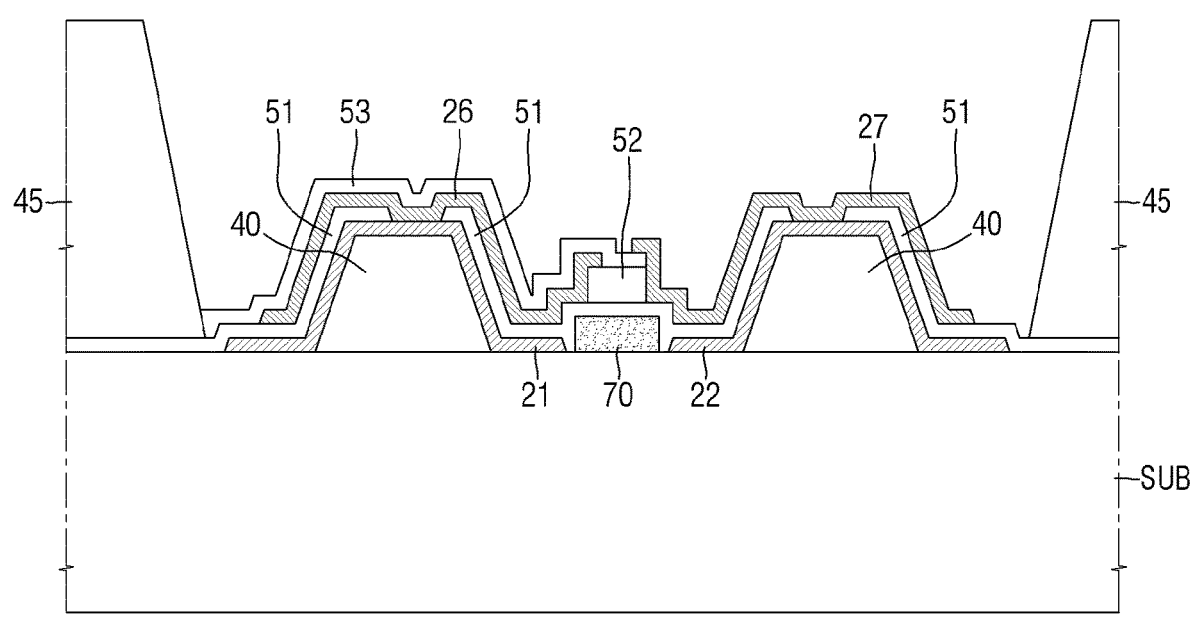
Figure 21:
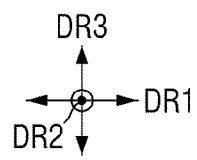

FIGS. 20 and 21 are schematic cross-sectional views illustrating processes of the method of fabricating a display device according to an embodiment of the disclosure. Specifically, FIGS. 20 and 21 illustrate schematic cross-sectional views of first patterns 70 having no light-emitting elements 30 disposed thereon.

Referring to FIG. 21, the first insulating layer 51 may be formed by removing portions of the first insulating material layer 51' to expose the top surfaces of the first and second electrode layers 21' and 22'. The first insulating layer 51 may include openings OP, which expose portions of the electrode layers (21' and 22'). The top surfaces of the electrode layers (21' and 22'), exposed by the openings OP, may be in electrical contact with the contact electrodes (26 and 27).

Thereafter, the first and second electrodes 21 and 22 are formed by cutting the first and second electrode layers 21' and 22' in the cut area CBA of each subpixel PXn, and a second insulating layer 52, a third insulating layer 53, and the contact electrodes (26 and 27) are formed on the light-emitting elements 30. Electrical signals for the alignment of the light-emitting elements 30 may be applied to the electrode layers (21' and 22') electrically connected to each subpixel PXn. For the driving of the display device 10, however, the electrode layers (21' and 22') may be cut and separated in the cut area CBA of each subpixel PXn, thereby forming the electrodes (21 and 22), and as a result, the electrodes (21 and 22) can be driven separately via a first transistor TR1 of each subpixel PXn.

Thereafter, although not specifically illustrated, a fourth insulating layer 54, which covers the elements disposed on the target substrate SUB, may be formed, thereby fabricating the display device 10.

Display devices according to other embodiments of the disclosure will hereinafter be described.

A display device 10 includes first patterns 70, which are disposed between first banks 40, in each subpixel PXn. FIG. 6 illustrates that the width W1 of the first patterns 70 is smaller than the distance W3 between the electrodes (21 and 22), but the disclosure is not limited thereto. For example, the width W1 and the thickness DP of the first patterns 70 may vary as long as the light-emitting elements 30 can be properly guided to be aligned at particular locations.

Figure 22:
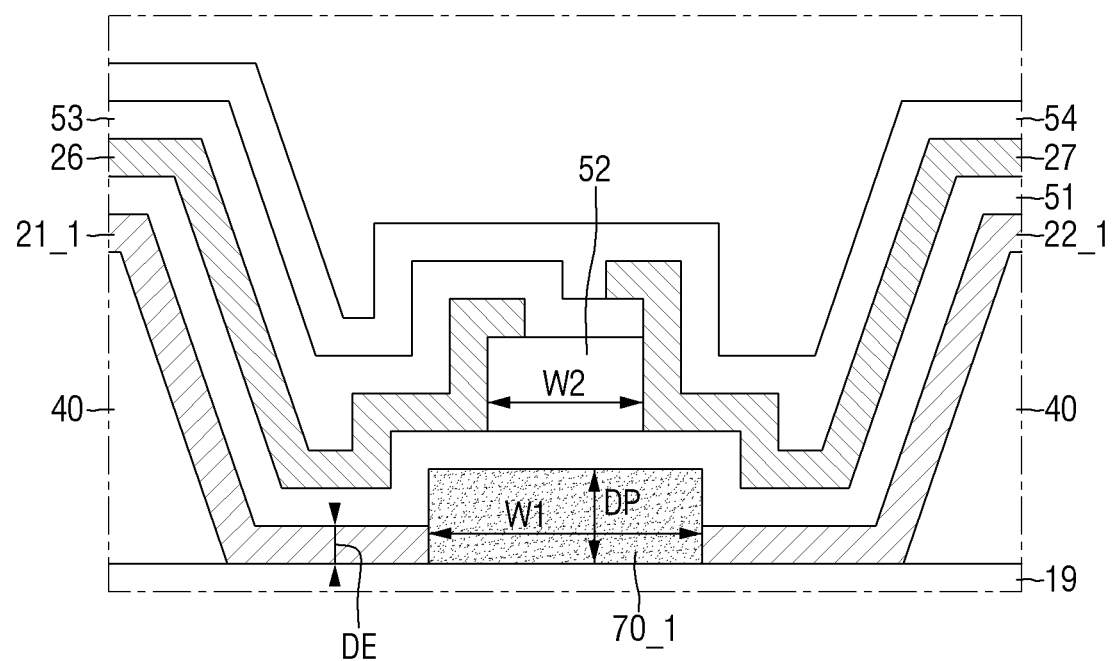
FIGS. 22 through 24 are schematic partial cross-sectional views of display devices according to other embodiments of the disclosure.
Figure 23:
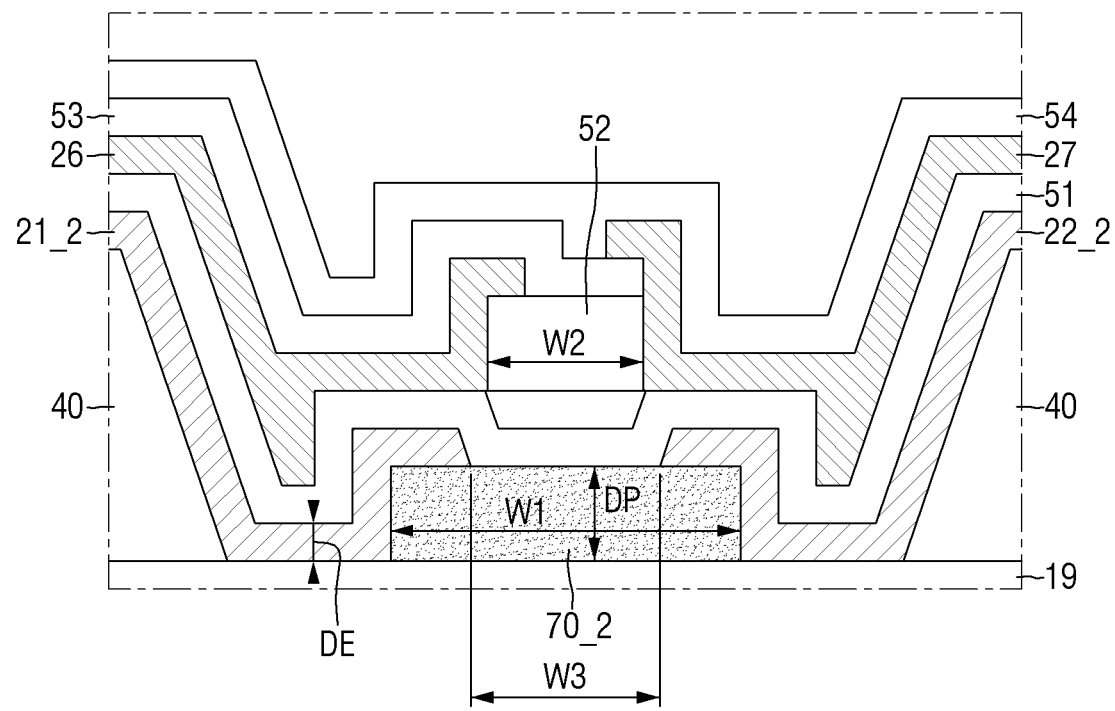
Figure 24:
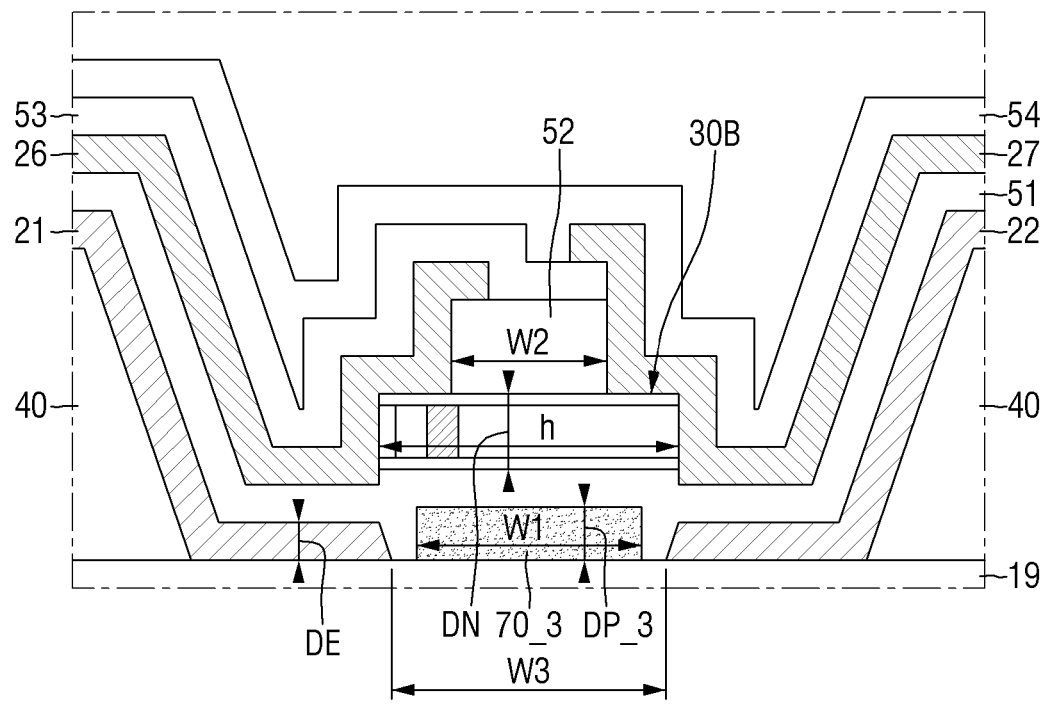

FIGS. 22 through 24 are schematic partial cross-sectional views of display devices according to other embodiments of the disclosure. Specifically, FIGS. 22 and 23 illustrate schematic cross-sectional views of first patterns 70_1 or 70_2 having no light-emitting elements 30 disposed thereon, and FIG. 24 illustrate a schematic cross-sectional view of first patterns 703 having second light-emitting elements 30B disposed thereon.

Referring to FIG. 22, a width W1 of first patterns 70_1 may be the same as a distance W3 between electrodes (21_1 and 22_1), and the first patterns 701 may be in electrical contact with the electrodes (21_1 and 22_1). The first patterns 701 may be formed to have a relatively large width W1 and to be in electrical contact with the electrodes (21_1 and 22_1), and a first insulating layer 51, which is disposed on the first patterns 701, may provide space in which second light-emitting elements 30B can be horizontally arranged.

Referring to FIG. 23, a width W1 of first patterns 70_2 may be greater than a distance W3 between electrodes (21_2 and 22_2), and first sides of the electrodes (21_2 and 22_2) may be disposed on the first patterns 70_2. The embodiment of FIG. 23 differs from the other embodiments at least in that the first sides of the electrodes (21_2 and 22_2) are disposed on the first patterns 70_2 because of the first patterns 70_2 having a relatively large width W1. Although not specifically illustrated, second light-emitting elements 30B disposed on the first patterns 70_2 may be arranged so that both ends thereof may be placed on the electrodes (21_2 and 22_2), and as a result, the second light-emitting elements 30B can be properly in electrical contact with contact electrodes (26 and 27). In the embodiment of FIG. 23, unlike in the embodiment of FIG. 5, the number of light-emitting elements 30 electrically connected to the electrodes (21_2 and 22_2), between first banks 40, can be further increased.

In case that first patterns 70 have a relatively small width, second light-emitting elements 30B may not be able to be properly in electrical contact with contact electrodes (26 and 27). Light-emitting elements 30 may be inclined, rather than being horizontally arranged, depending on the width of the first patterns 70, and electrical signals may not be able to be properly transmitted to the light-emitting elements 30 due to contact defects. By controlling the thickness of the first patterns 70, the light-emitting elements 30 can be guided to be placed between the first patterns 70, rather than on the first patterns 70, in case that the light emitting elements 30 are aligned by an electric field.

Referring to FIG. 24, a thickness DP_3 of first patterns 70_3 may be greater than a thickness DE of electrodes (21 and 22), but smaller than a diameter DN of light-emitting elements 30. In case that the thickness DP_3 of the first patterns 70_3 is smaller than the diameter DN of the light-emitting elements 30, the light-emitting elements 30 can be easily moved away from above the first patterns 70_3 by an electric field during the fabrication of a display device 10. If an electric field is generated for aligning the light-emitting elements 30 and is continued for more than a predetermined amount of time, light-emitting elements 30 disposed on the first patterns 70_3 may be moved to locations where the first patterns 70_3 are not disposed. Even light-emitting elements 30 disposed in regions other than that between first banks 40 can be moved over the first patterns 70_3. Second light-emitting elements 30B are illustrated as being disposed on the first patterns 703, but in an embodiment, a considerable number of light-emitting elements 30, similar to first light-emitting elements 30A, can be disposed not to overlap the first patterns 703. Since the first patterns 70_3 have a smaller thickness DP_3 than the diameter DN of the light-emitting elements 30, most of the light-emitting elements 30 can be arranged similar to the first light-emitting elements 30A. For example, the thickness DP_3 of the first patterns 703 may be smaller than half the diameter DN of the light-emitting elements 30.

The shape of first patterns 70 may vary as long as the first patterns 70 can generate height differences between first banks 40 and can properly guide light-emitting elements 30 to be placed at particular locations. For example, the shape of the first patterns 70 may vary as long as at least some light-emitting elements 30 electrically connected to first and second electrodes 21 and 22 can be located higher or lower than other light-emitting elements 30.

Figure 25:
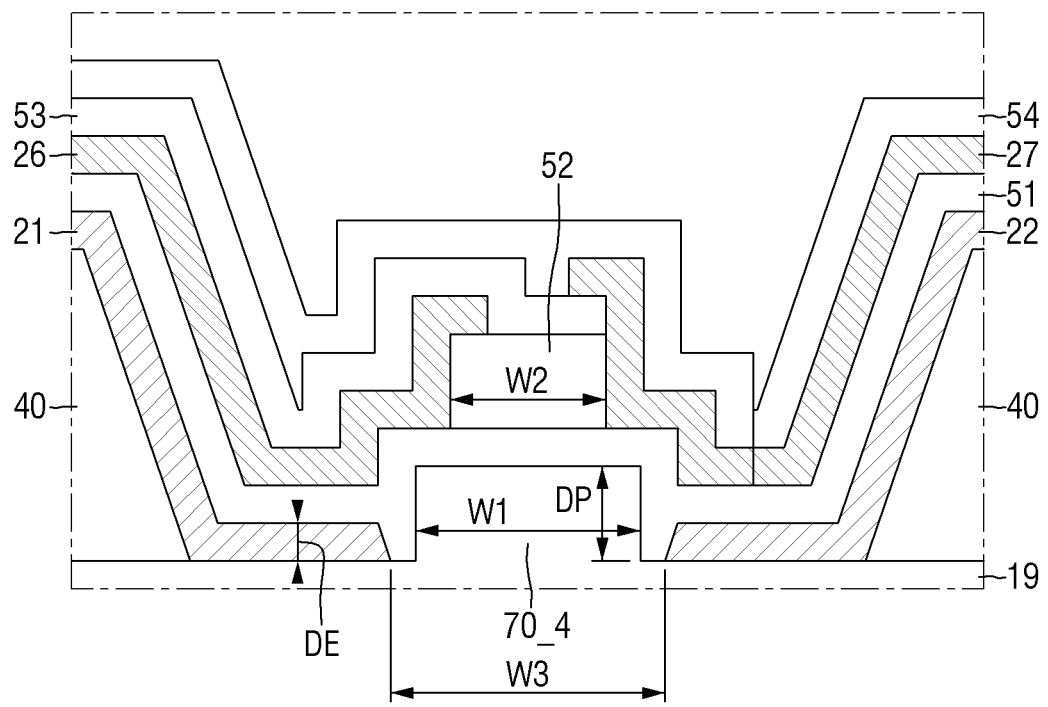
FIGS. 25 and 26 are schematic partial cross-sectional views of display devices according to other embodiments of the disclosure.
Figure 26:
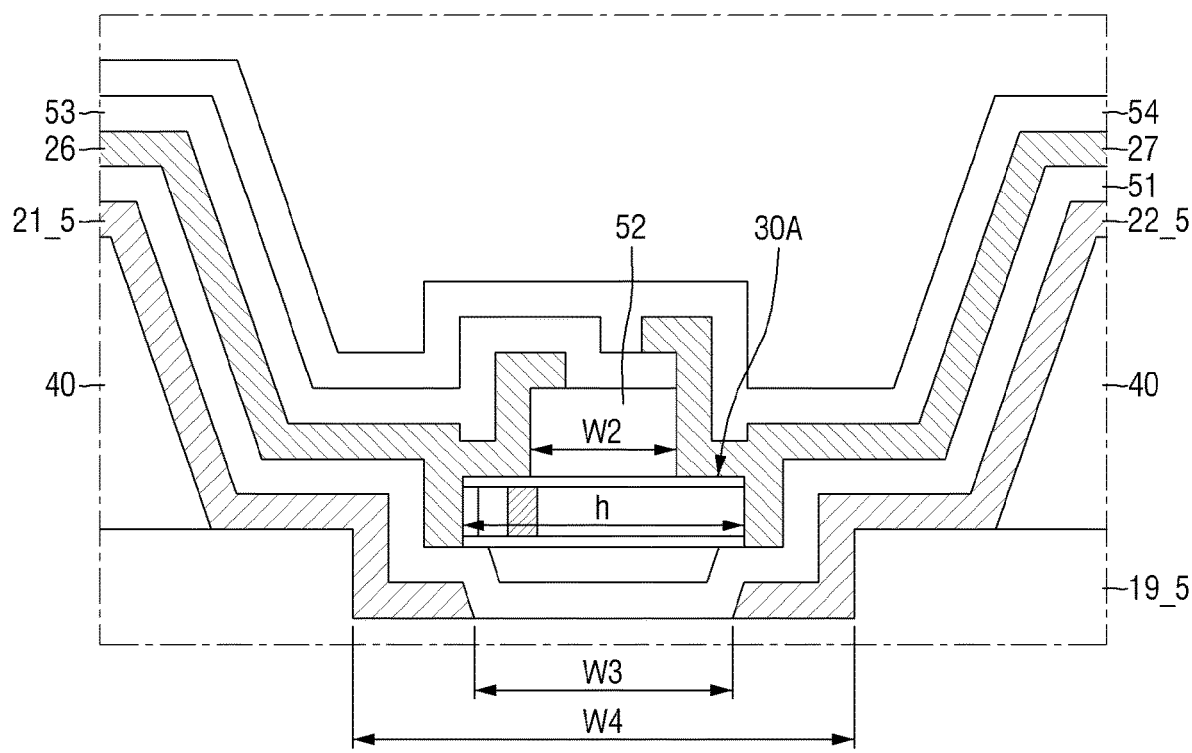

FIGS. 25 and 26 are schematic partial cross-sectional views of display devices according to other embodiments of the disclosure.

Specifically, FIG. 25 illustrates a schematic cross-section view of first patterns 70_4 with no light-emitting elements 30 disposed thereon. Referring to FIG. 25, the first patterns 70_4 may be integrally formed with (or integral with) a first planarization layer 19, which is disposed below the first patterns 70_4. During the formation of the first planarization layer 19, portions of the top surface of the first planarization layer 19 may be formed to protrude and thus to form the first patterns 70_4. The first patterns 70_4 may be formed in various processes during the fabrication of a display device 10. As already mentioned above, the first patterns 70_4 may be formed during or after the formation of the first banks 40, and the first patterns 70_4 may be formed by making portions of the top surface of the first planarization layer 19 protrude. The embodiment of FIG. 25 differs from the embodiment of FIG. 5 at least in that the first patterns 70_4 are integrally formed with the first planarization layer 19. The first planarization layer 19 may include the first patterns 70_4, which are formed as protrusions from the top surface of the first planarization layer 19, and portions where the first patterns 70_4 are not formed. Among light-emitting elements 30, first light-emitting elements 30A may be disposed on the portions of the first planarization layer 19 where the first patterns 70_4 are not formed, and second light-emitting elements 30B may be disposed on the first patterns 70_4. Most of the light-emitting elements 30 can be guided to be placed between the first patterns 70_4, rather than on the first patterns 70_4, during the fabrication of the display device 10.

Referring to FIG. 26, a first planarization layer 19_5 may include recesses where portions the top surface of the first planarization layer 19_5 are depressed between first banks 40, and at least some of light-emitting elements 30 may be disposed in the recesses. During the formation of the first planarization layer 195, the recesses may be formed between the first banks 40. During the fabrication of a display device 10, a process of generating height differences may be performed to allow the light-emitting elements 30 to be placed at different locations. For example, after the formation of the first planarization layer 195, the recesses may be formed between the first banks 40 during the formation of first and second contact holes CT1 and CT2. As the recesses are formed between the first banks 40, height differences are generated in a second direction DR2, and the light-emitting elements 30 disposed between the first banks 40 may be arranged to have different heights from the top surface of a first substrate 11. The embodiment of FIG. 26 differs from the other embodiments at least in that portions of the top surface of the first planarization layer 19_5 are depressed.

For example, a width W4 of the recesses may be greater than a distance W3 between electrodes (21_5 and 22_5), and at least a portion of the electrodes (21_5 and 22_5) may be disposed in the recesses. The light-emitting elements 30 can be guided to be moved into the recesses by an electric field, and some or most of the light-emitting elements 30 can be disposed in the recesses. First light-emitting elements 30A are illustrated as being disposed in the recesses, but the disclosure is not limited thereto. The light-emitting elements 30 may further include second light-emitting elements 30B, which are disposed on portions of the first planarization layer 19_5 where the recesses are not formed and are located higher than the first light-emitting elements 30A.

The shape of the first patterns 70, 70_1, 70_2, 70_3, and 70_4 is not particularly limited. The first patterns 70, 70_1, 70_2, 70_3, and 70_4 are illustrated as having a rectangular shape in a plan view or a cross-sectional view, but the disclosure is not limited thereto.

Figure 27:
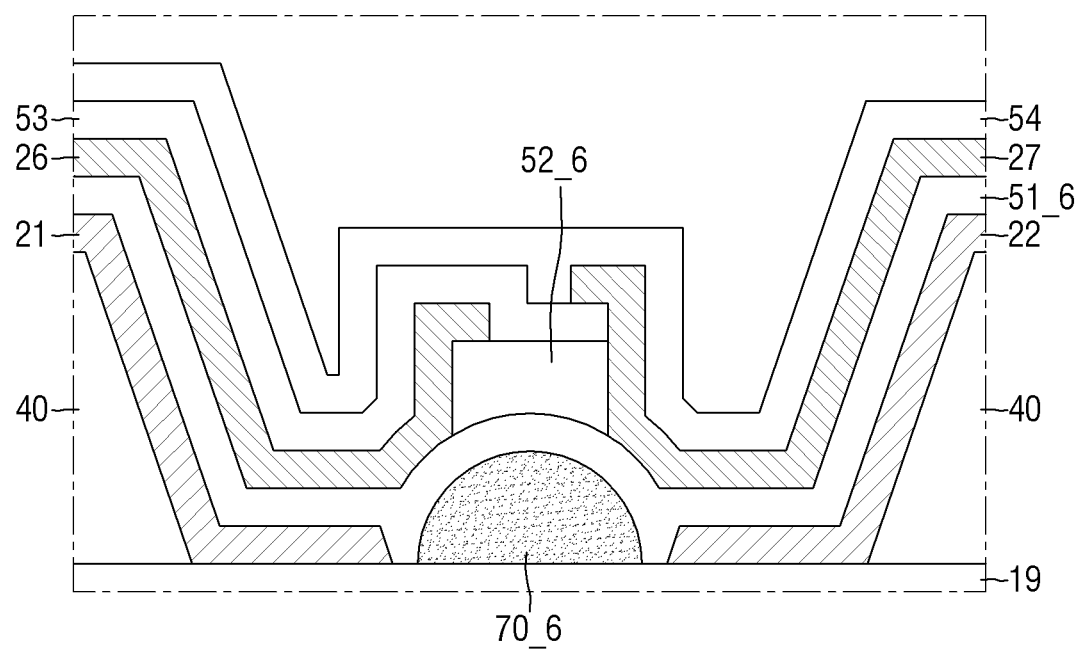
FIG. 27 is a schematic partial cross-sectional view of a display device according to another embodiment of the disclosure.
Figure 28:
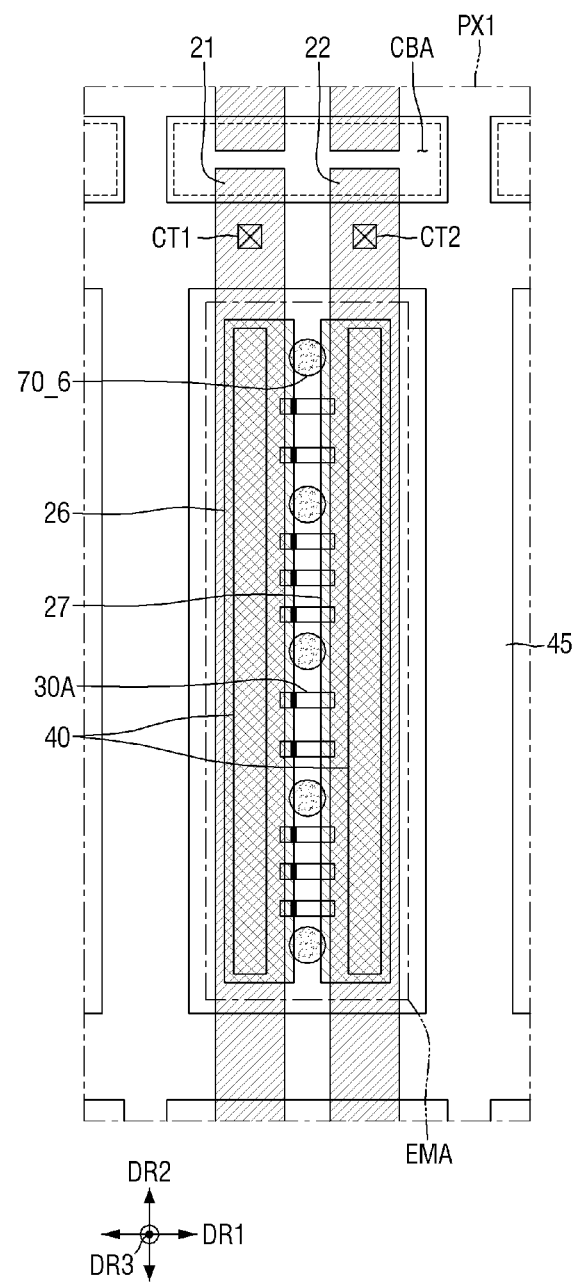
FIG. 28 is a schematic plan view of a subpixel of the display device of FIG. 27.

FIG. 27 is a schematic partial cross-sectional view of a display device according to another embodiment of the disclosure. FIG. 28 is a schematic plan view of a subpixel of the display device of FIG. 27.

Referring to FIGS. 27 and 28, the top surfaces of first patterns 70_6 may be curved. In some embodiments, the first patterns 70_6 may have a hemispherical shape and/or may be circular in a plan view and semicircular in a cross-sectional view. Portions of a first insulating layer 51_6 on the first patterns 70_6 may not have a flat top surface, and the positions of light-emitting elements 30 disposed on the portions of the first insulating layer 51_6 may be changed by an electric field so that the light-emitting elements 30 may not overlap the first patterns 70_6. As a result, the light-emitting elements 30 may not be disposed on the first patterns 70_6, and portions of a second insulating layer 52_6 that overlap the first patterns 70_6 may be in direct contact with the first insulating layer 51_6. The embodiment of FIGS. 27 and 28 differs from the other embodiments at least in that the first patterns 70_6 may have a curved top surface and only first light-emitting elements 30A (and no second light-emitting elements 30B) are provided.

Figure 29:
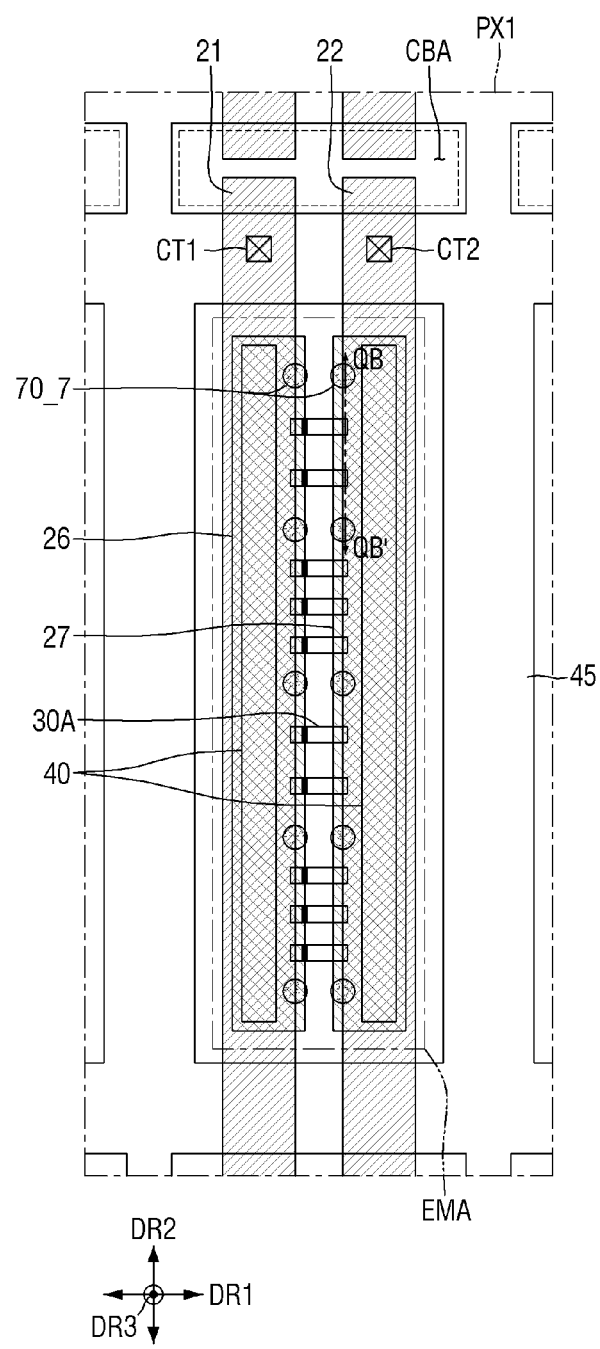
FIG. 29 is a schematic plan view of a subpixel of a display device according to another embodiment of the disclosure.
Figure 30:
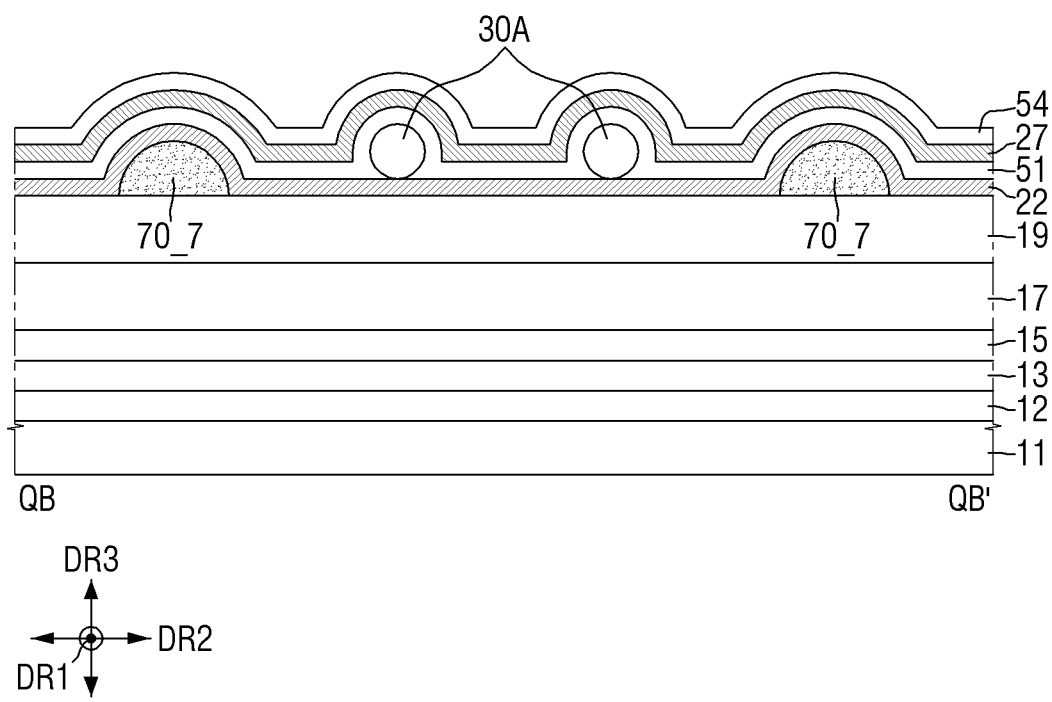
FIG. 30 is a schematic cross-sectional view taken along line QB-QB' of FIG. 29.
Figure 31:
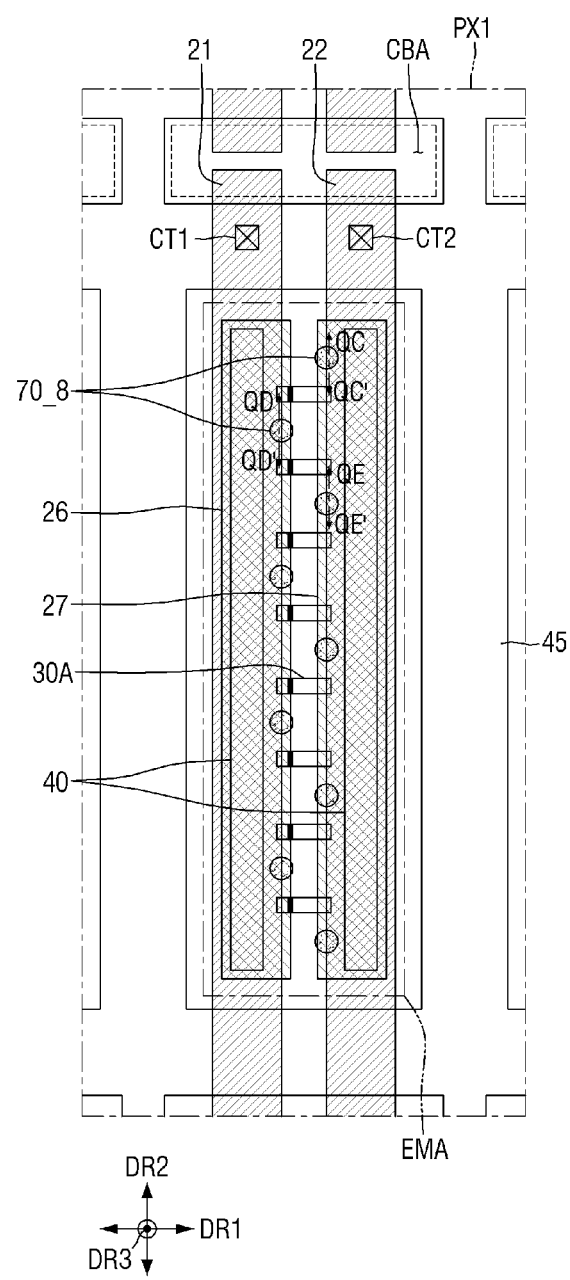
FIG. 31 is a schematic plan view of a subpixel of a display device according to another embodiment of the disclosure.
Figure 32:
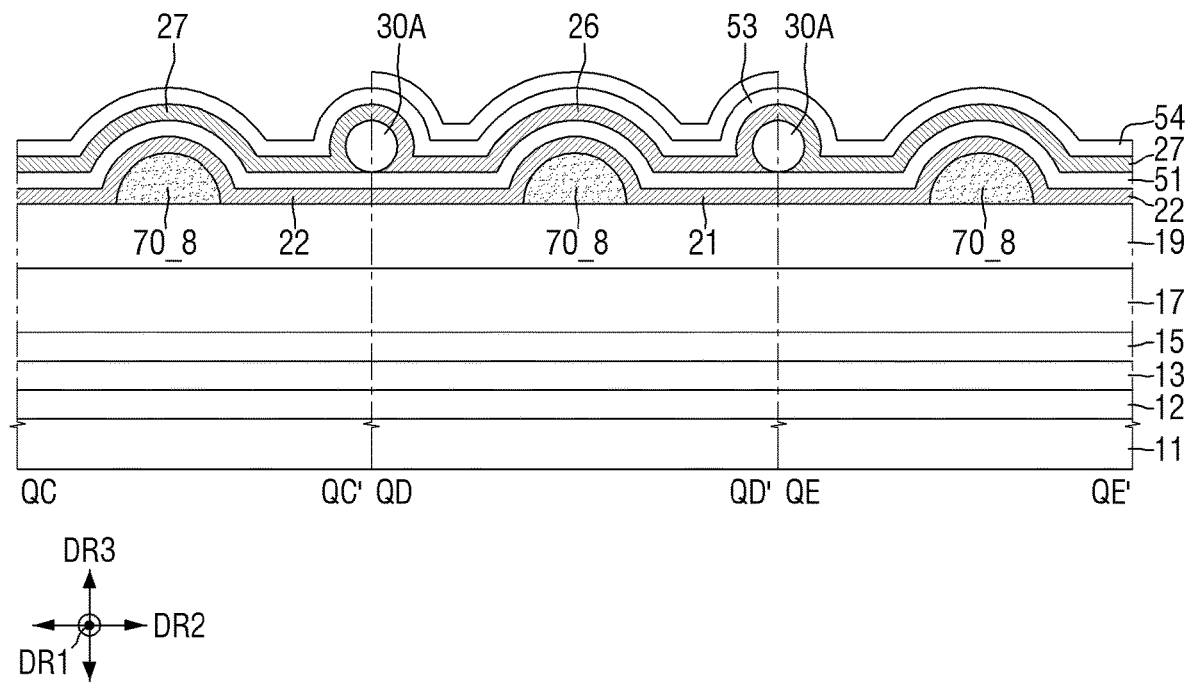
FIG. 32 is a schematic cross-sectional view taken along lines QC-QC', QD-QD', and QE-QE' of FIG. 31.

FIG. 29 is a schematic plan view of a subpixel of a display device according to another embodiment of the disclosure. FIG. 30 is a schematic cross-sectional view taken along line QB-QB' of FIG. 29. FIG. 31 is a schematic plan view of a subpixel of a display device according to another embodiment of the disclosure. FIG. 32 is a schematic cross-sectional view taken along lines QC-QC', QD-QD', and QE-QE' of FIG. 31. FIGS. 30 and 32 illustrate schematic cross-sectional views, taken in a second direction DR2, of first patterns 70_7 and light-emitting elements 30.

Referring to FIGS. 29 through 32, first patterns 70_7 or 70_8 may be disposed to overlap a first electrode 21 or a second electrode 22. The first patterns 70_7 or 70_8 may be disposed directly on a first planarization layer 19 where the first and second electrodes 21 and 22 are disposed and may generate height differences in the first and second electrodes 21 and 22. The first patterns 70_7 or 70_8 may have such a small width that light-emitting elements 30 can be easily moved away from the first patterns 70_7 or 70_8 even if they are disposed on the first patterns 70_7 or 70_8, and may be disposed to overlap electrodes (21 and 22). In the embodiments of FIGS. 29 through 32, unlike in an embodiment where the first patterns 70_7 or 70_8 are disposed between the electrodes (21 and 22), some or most of the light-emitting elements 30 (e.g., first light-emitting elements 30A of FIGS. 30 and 32) can be disposed not to overlap the first patterns 70_7 or 70_8 because height differences are generated in portions of the electrodes (21 and 22) where the ends of the light-emitting elements 30 are disposed.

In some embodiments, first patterns 70_7 or 70_8 that overlap the first electrode 21 and first patterns 70_7 or 70_8 that overlap the second electrode 22 may be arranged either parallel to each other or in a staggered manner between first banks 40. For example, as illustrated in FIGS. 29 and 30, the first patterns 70_7 or 70_8 that overlap the first electrode 21 and the first patterns 70_7 or 70_8 that overlap the second electrode 22 may be arranged parallel to each other between the first banks 40. In another example, as illustrated in FIGS. 31 and 32, the first patterns 70_7 or 70_8 that overlap the first electrode 21 and the first patterns 70_7 or 70_8 that overlap the second electrode 22 may be arranged in a staggered manner between the first banks 40.

During the fabrication of a display device 10, even if first ends of the light-emitting elements 30 are disposed on the first patterns 70_7 or 70_8, second ends of the light-emitting elements 30 may not be disposed on the first patterns 70_7 or 70_8, or vice versa. In this case, in the presence of an electric field, the light-emitting elements 30 can be moved to regions where the first patterns 70_7 or 70_8 are not formed. Since the first patterns 70_7 or 70_8 have a relatively small width and are disposed to overlap the electrodes (21 and 22), the light-emitting elements 30 can be properly guided toward locations where the first patterns 70_7 or 70_8 are not disposed, even if ends of the light-emitting elements 30 are disposed on the first patterns 70_7 or 70_8.

The first and second electrodes 21 and 22 may not necessarily extend in one direction. In some embodiments, the electrodes (21 and 22) may include portions that extend in one direction to have different widths and portions that extend in another direction.

Figure 33:
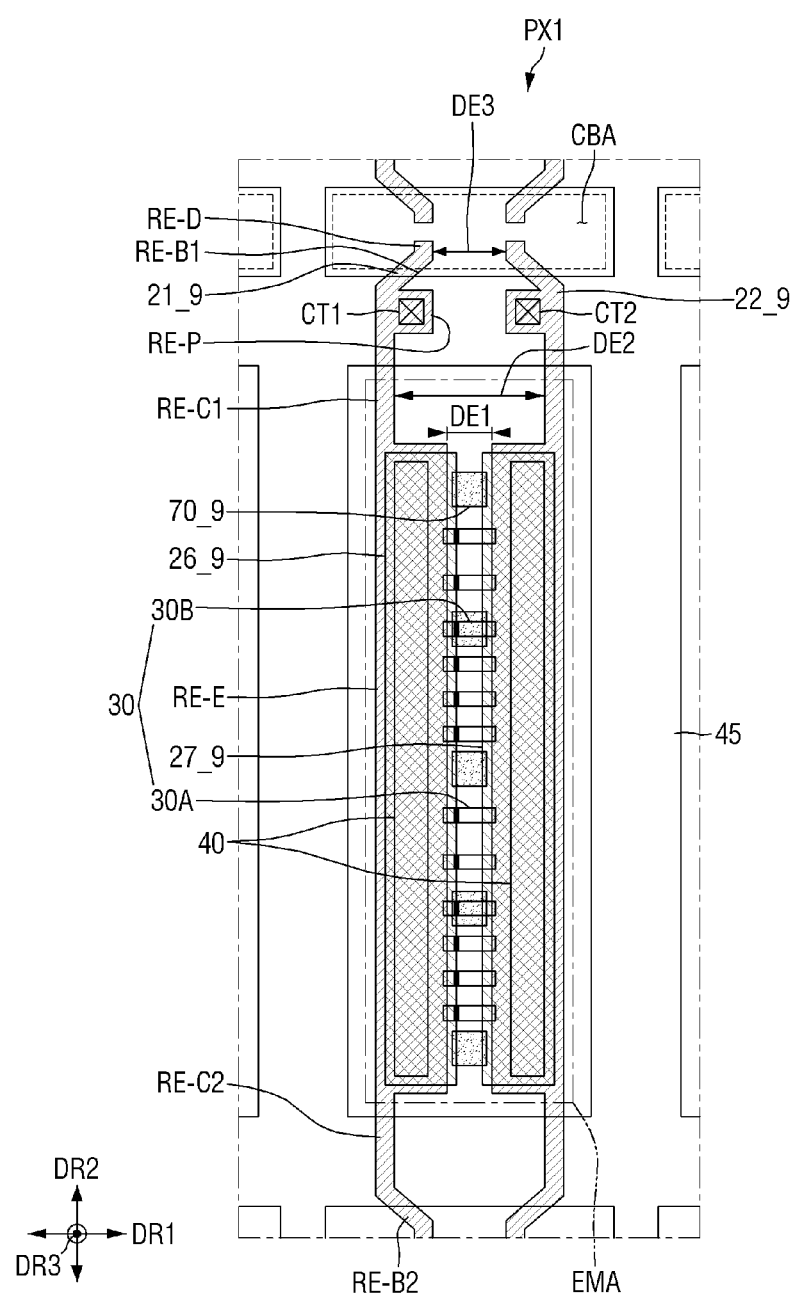
FIG. 33 is a schematic plan view of a subpixel of a display device according to another embodiment of the disclosure.

FIG. 33 is a schematic plan view of a subpixel of a display device according to another embodiment of the disclosure.

Referring to FIG. 33, each of electrodes (21_9 and 22_9) may include an extended portion RE-E, which generally extends in a second direction and has a greater width than the rest of the corresponding electrode, bent portions (RE-B1 and RE-B2), which extend in a diagonal direction with respect to a first direction DR1 or the second direction DR2, and connecting portions (RE-C1 and RE-C2), which connect the bent portions (RE-B1 and RE-B2) and the extended portion RE-E. The electrodes (21_9 and 22_9) may generally extend in the second direction DR2 but may have a relatively large width in portion or may be bent in a diagonal direction with respect to the second direction DR2. First and second electrodes 21_9 and 22_9 may be arranged symmetrically with respect to a first pattern 70_9 disposed therebetween. The shape of the first electrode 21_9 will hereinafter be described.

The first electrode 21_9 may include an extended portion RE-E, which has a greater width than the rest of the first electrode 21_9. Extended portions RE-E of the first and second electrodes 21_9 and 22_9 may be disposed on first banks 40, in an emission area EMA of a first subpixel PX1, to extend in the second direction DR2. The first pattern 70_9 may be disposed between the extended portions RE-E, and light-emitting elements 30 may be disposed on the extended portions RE-E. First and second contact electrodes 26_9 and 27_9 may be disposed on the extended portions RE-E but may have a smaller width than the extended portions RE-E.

Connecting portions (RE-C1 and RE-C2) may extend or be connected to both sides, in the second direction DR2, of each of the extended portion RE-E. First connecting portions RE-C1 may be disposed on first sides, in the second direction DR2, of the extended portions RE-E, and second connecting portions RE-C2 may be disposed on second sides, in the second direction DR2, of the extended portions RE-E. The connecting portions (RE-C1 and RE-C2) may extend or be connected to the extended portions RE-E of the corresponding electrode and may be disposed in and across the emission area EMA and a second bank 45.

The first connecting portions RE-C1 and the second connecting portions RE-C2 may have a smaller width than the extended portions RE-E. First sides of the connecting portions (RE-C1 and RE-C2) that extend in the second direction DR2 may extend or be connected to, and fall on the same line as, a first side of the respective extended portion RE-E that extends in the second direction DR2. For example, an outer side of the extended portion RE-E of each of the electrodes (21_9 and 22_9) may extend to be electrically connected to outer sides of the connecting portions (RE-C1 and RE-C2) of the corresponding electrode. Accordingly, a distance DE1 between the extended portions RE-E of the first and second electrodes 21_9 and 22_9 may be smaller than a distance DE2 between the connecting portions (RE-C1 and RE-C2) of the first and second electrodes 21_9 and 22_9.

Bent portions (RE-B1 and RE-B2) extend or are connected to the connecting portions (RE-C1 and RE-C2). The bent portions (RE-B1 and RE-B2) may include first bent portions RE-B1, which extend or are connected to first connecting portions RE-C1 and are disposed on the second bank 45 and in a cut area CBA, and second bent portions RE-B2, which extend or are connected to second connecting portions RE-C2 and are disposed on the second bank 45 and in a cut area CBA of another subpixel PXn. The bent portions (RE-B1 and RE-B2) may be electrically connected to the connecting portions (RE-C1 and RE-C2) and may be bent in a diagonal direction with respect to the second direction DR2, for example, in a direction toward the center of the first subpixel PX1. A minimum distance DE3 between the bent portions (RE-B1 and RE-B2) may be smaller than the distance DE2 between the connecting portions (RE-C1 and RE-C2) but may be greater than the distance DE1 between the extended portions RE-E.

Contact portions RE-P may be formed in regions where the first connecting portions RE-C1 and the first bent portions RE-B1 are electrically connected. The contact portions RE-P may overlap the second bank 45 so that first and second contact holes CT1 and CT2 of the first and second electrodes 21_9 and 22_9 may be formed.

Fragment portions RE-D, which are obtained when the first and second electrodes 21_9 and 22_9 are separated into pieces in the cut area CBA, may be formed at first ends of the first bent portions RE-B1. The fragment portions RE-D may be portions of first and second electrodes 21_9 and 22_9 of a neighboring subpixel PXn in the second direction DR2 that remain in the cut area CBA.

The embodiment of FIG. 33 differs from the embodiment of FIG. 4 at least in that each of the first and second electrodes 21_9 and 22_9 includes an extended portions RE-E, connecting portions (RE-C1 and RE-C2), and bent portions (RE-B1 and RE-B2) and are arranged symmetrically with respect to the center of the first subpixel PX1. However, the disclosure is not limited to this. As another example, the first and second electrodes 21_9 and 22_9 may have different shapes.

Figure 34:
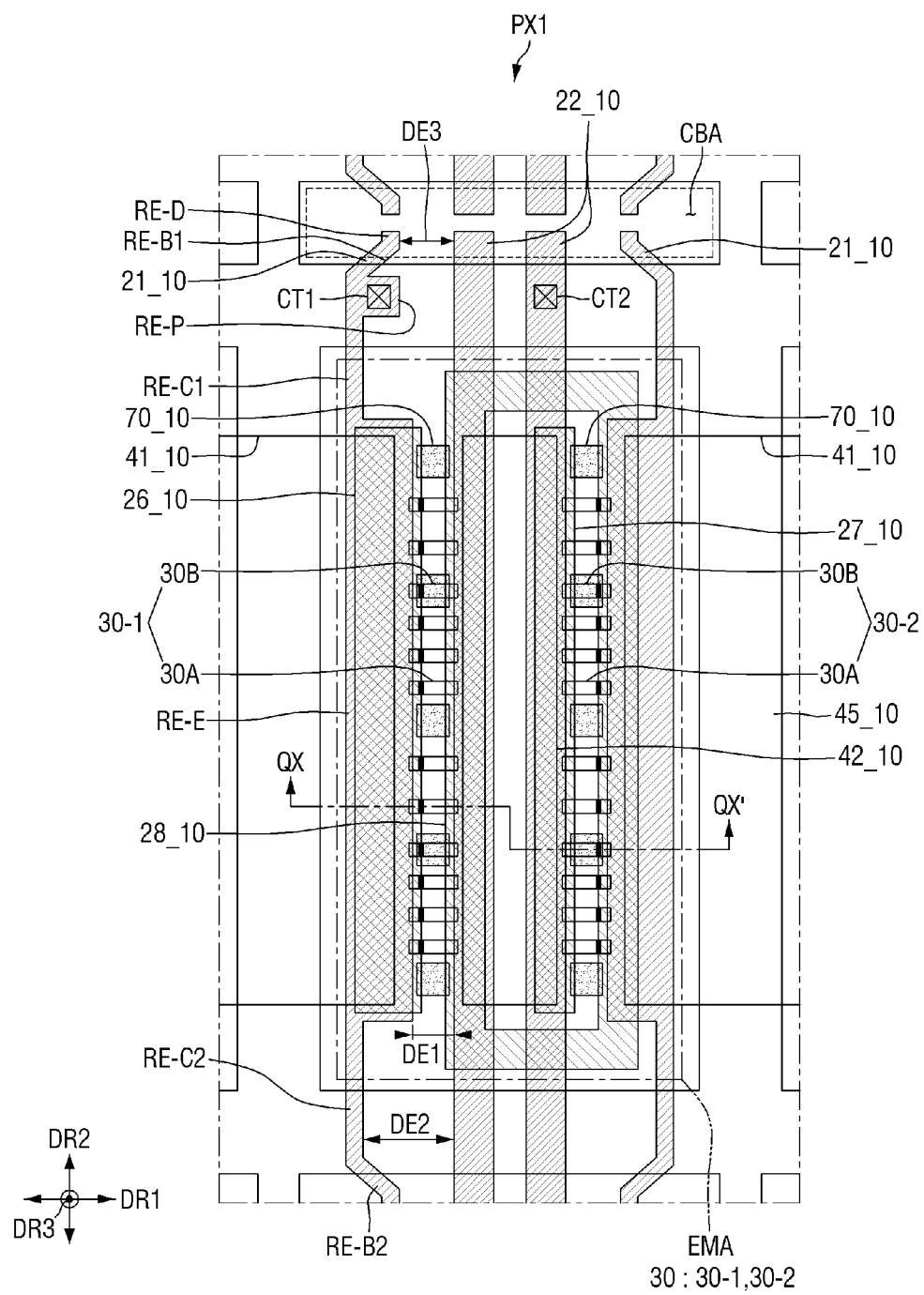
FIG. 34 is a schematic plan view of a subpixel of a display device according to another embodiment of the disclosure.
Figure 35:
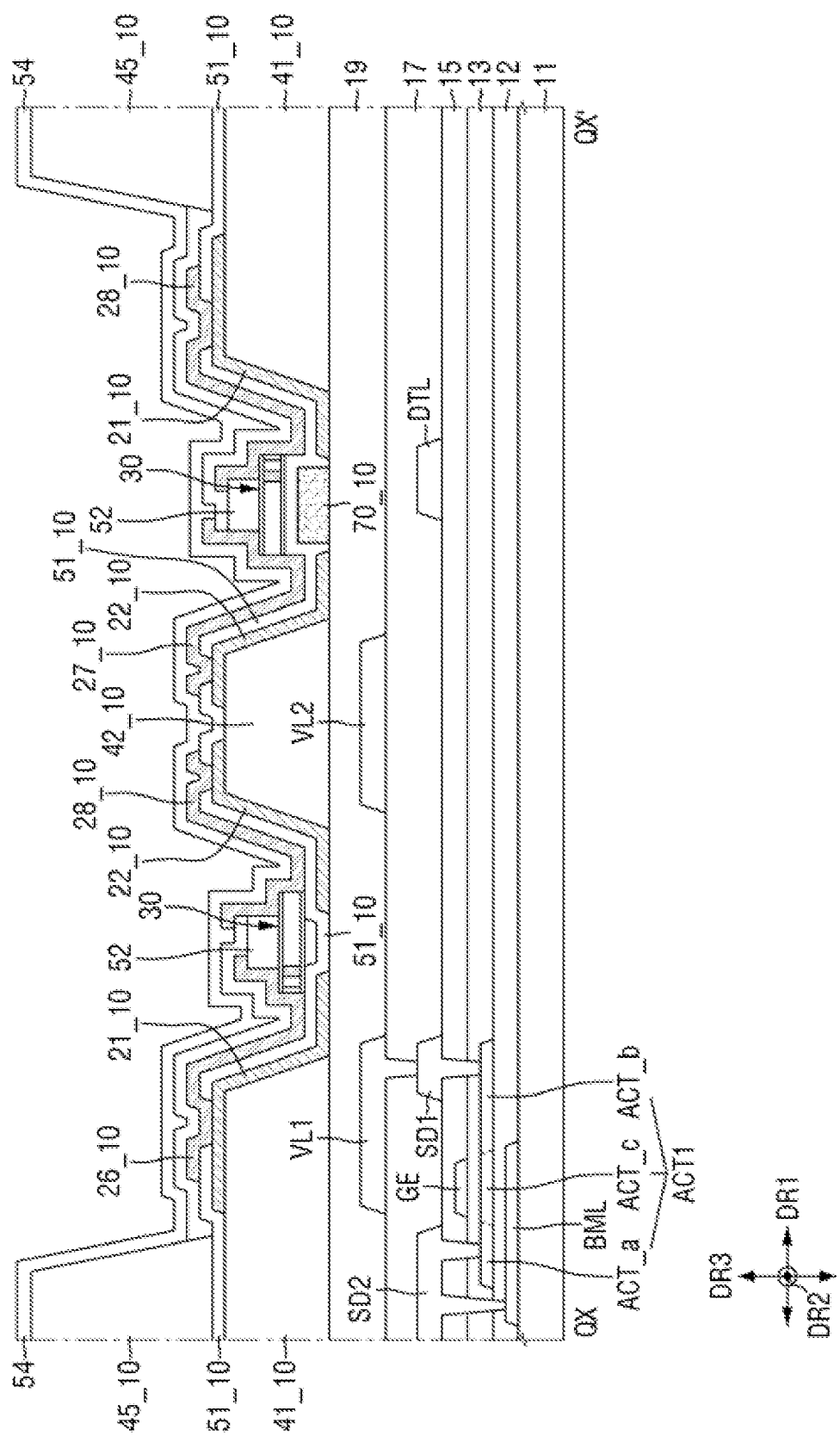
FIG. 35 is a schematic cross-sectional view taken along line QX-QX' of FIG. 34.

FIG. 34 is a schematic plan view of a subpixel of a display device according to another embodiment of the disclosure. FIG. 35 is a schematic cross-sectional view taken along line QX-QX' of FIG. 34.

Referring to FIGS. 34 and 35, a display device 10 may include, in each subpixel PXn thereof, for example, in a first subpixel PX1, first electrodes 21_10, second electrodes 22_10, and first patterns 70_10. The first electrodes 21_10 may have the same shape as their counterpart of FIG. 28, and first electrodes 21_10, for example, two first electrodes 21_10, may be arranged symmetrically with respect to the center of the first subpixel PX1. The second electrodes 22_10 may have the same shape as their counterpart of FIG. 2, and second electrodes 22_10, for example, two second electrodes 22_10, may be arranged between the first electrodes 21_10. The distance between the first electrodes 21_10 and the second electrodes 22_10 may differ from one location to another location on the first electrodes 21_10. For example, a distance DE1 between extended portions RE-E of the first electrodes 21_10 and the second electrodes 22_10 may be smaller than a distance DE2 between connecting portions (RE-C1 and RE-C2) of the first electrodes 21_10 and the second electrodes 22_10 and a distance DE3 between bent portions (RE-B1 and RE-B2) of the first electrodes 21_10 and the second electrodes 22_10. The distance DE2 between the connecting portions (RE-C1 and RE-C2) of the first electrodes 21_10 and the second electrodes 22_10 may be greater than the distance DE3 between the bent portions (RE-B1 and RE-B2) of the first electrodes 21_10 and the second electrodes 22_10. However, the disclosure is not limited to this. The shapes of electrodes (21_10 and 22_10) is the same as the shapes of their respective counterparts of any one of FIGS. 2 through 33, and thus, detailed descriptions thereof will be omitted.

The arrangement and the shapes of first banks 41_10, a first insulating layer 51_10, and contact electrodes (26_10, 27_10, and 28_10) may vary depending on the arrangement of the first electrodes 21_10 and the second electrodes 22_10.

The first insulating layer 51_10 may be disposed between, and be in contact with, the extended portions RE-E of the first electrodes 21_10 and the second electrodes 22_10. First ends of light-emitting elements 30 may be disposed on the extended portions RE-E of the first electrodes 21_10, and second ends of the light-emitting elements 30 may be disposed on the second electrodes 22_10.

The first banks 40 may include first sub-banks 41_10 and a second sub-bank 42_10. The first sub-banks 41_10 and the second sub-bank 42_10 may extend in a second direction DR2, and the first sub-banks 41_10 may have a different width in a first direction DR1 than the second sub-bank 42_10. As the first sub-banks 41_10 have a larger width in the first direction DR1 than the second sub-bank 42_10, the first sub-banks 41_10 may be disposed across the boundaries between the first subpixel PX1 and neighboring subpixels PXn, in the first direction DR1, of the first subpixel PX1. For example, the first sub-banks 41_10 may be disposed not only in an emission area EMA of the first subpixel PX1, but also between the emission area EMA of the first subpixel PX1 and emission areas EMA of the neighboring subpixels PXn. Accordingly, portions of a second bank 45_10 that extend in the second direction DR2 may be disposed on the first sub-banks 41_10. Two first sub-banks 41_10 may be disposed in portion in each subpixel PXn, and one second sub-bank 42_10 may be disposed between the two first sub-banks 41_10.

The second sub-bank 42_10 may extend in the second direction DR2 in the middle of the emission area EMA of the first subpixel PX1. The second sub-bank 42_10 may have a smaller width than the first sub-banks 41_10 and may be spaced apart from the first sub-banks 41_10.

The extended portions RE-E of the first electrodes 21_10 and the second bank 45_10 may be disposed on the first sub-banks 41_10. Extended portions RE-E of first electrodes 21_10 of the neighboring subpixels PXn may be disposed on the first sub-banks 41_10. For example, extended portions RE-E of two first electrodes 21_10 may be disposed on one first sub-bank 41_10, and two second electrodes 22_10 may be disposed on one second sub-bank 42_10. The second electrodes 22_10 may be disposed along both sides of the second sub-bank 42_10 that extend in the second direction DR2 and may be spaced apart from each other with the second sub-bank 42_10 therebetween.

One of the first electrodes 21_10 may include a contact portion RE-P, in which a first contact hole CT1 is formed, and the other first electrode 21_10 may not include a contact portion RE-P. Similarly, one of the second electrodes 22_10 may include a contact portion RE-P, in which a second contact hole CT2 is formed, and the other second electrode 22_10 may not include a contact portion RE-P. Some of the electrodes (21_10 and 22_10) electrically connected to a first transistor TR1 or a second voltage line VL2 may receive electrical signals via contact holes (CT1 and CT2), and the other electrodes (21_10 and 22_10) may receive electrical signals via the contact electrodes (26_10, 27_10, and 28_10).

Both ends of each of the light-emitting elements 30 are disposed on the extended portions RE-E of the first electrodes 21_10 and the second electrodes 22_10, on the first insulating layer 51_10. First ends of the light-emitting elements 30 where second semiconductor layers 32 are disposed may be disposed on the first electrodes 21_10. Accordingly, first ends of first-type light-emitting elements 30-1, which are disposed between leftward electrodes (21_10 and 22_10) that are disposed on the left side of the center of the first subpixel PX1, and first ends of second-type light-emitting elements 30-2, which are disposed between rightward electrodes (21_10 and 22_10) that are disposed on the right side of the center of the first subpixel PX1, may face opposite directions.

The display device 10 may include a relatively large number of electrodes (21_10 and 22_10) and may thus include a relatively large number of contact electrodes (26_10, 27_10, and 28_10).

The contact electrodes (26_10, 27_10, and 28_10) may include a first contact electrode 26_10, which is disposed on one of the first electrodes 21_10, a second contact electrode 27_10, which is disposed on one of the second electrodes 22_10, and a third contact electrode 28_10, which is disposed on the other first electrode 21_10 and the other second electrode 22_10 and surrounds the second contact electrode 27_10.

The first contact electrode 26_10 may be disposed on one of the first electrodes 21_10. For example, the first contact electrode 26_10 may be disposed on the extended portion RE-E of the first electrode 21_10 where the first ends of the first-type light-emitting elements 30-1 are disposed. The first contact electrode 26_10 may be in electrical contact with the first ends of the first-type light-emitting elements 30-1 and with the extended portion RE-E of the first electrode 21_10 where the first ends of the first-type light-emitting elements 30-1 are disposed. The second contact electrode 27_10 may be disposed on one of the second electrodes 22_10. For example, the second contact electrode 27_10 may be disposed on the second electrode 22_10 where the first ends of the second-type light-emitting elements 30-2 are disposed. The second contact electrode 27_10 may be in electrical contact with the first ends of the second-type light-emitting elements 30-2 and with the second electrode 22_10 where the first ends of the second-type light-emitting elements 30-2 are disposed. The first and second contact electrodes 26_10 and 27_10 may be in electrical contact with the electrodes (21_10 and 22_10) where the first and second contact holes CT1 and CT2 are formed. The first contact electrode 26_10 may be in electrical contact with the first electrode 21_10 electrically connected to the first transistor TR1, via the first contact hole CT1, and the second contact electrode 27_10 may be in electrical contact with the second electrode 22_10 electrically connected to the second voltage line VL2, via the second contact hole CT2. The first and second contact electrodes 26_10 and 27_10 may transmit electrical signals applied thereto from the first transistor TR1 or the second voltage line VL2 to the light-emitting elements 30. The first and second contact electrodes 26_10 and 27_10 may be substantially the same as their respective counterparts of any one of FIGS. 2 through 33.

Electrodes (21_10 and 22_10) where the contact holes (CT1 and CT2) are not formed may be further disposed in the first subpixel PX1. The electrodes (21_10 and 22_10) where the contact holes (CT1 and CT2) are not formed may be in a floating state with substantially no electrical signals applied directly thereto from the first transistor TR1 or the second voltage line VL2. The third contact electrode 28_10 may be disposed on the electrodes (21_10 and 22_10) where the contact holes (CT1 and CT2) are not formed, and electrical signals transmitted to the light-emitting elements 30 may flow via the third contact electrode 28_10.

The third contact electrode 28_10 may be disposed on the electrodes (21_10 and 22_10) where the contact holes (CT1 and CT2) are not formed and may be disposed to surround the second contact electrode 27_10. The third contact electrode 28_10 may include portions that extend in the second direction DR2 and a portion that extends in the first direction DR1 to connect the portions that extend in the second direction DR2, and may thus surround the second contact electrode 27_10. The portions of the third contact electrode 28_10 that extend in the second direction DR2 may be disposed on the electrodes (21_10 and 22_10) where the contact holes (CT1 and CT2) are not formed, to be in electrical contact with the light-emitting elements 30. For example, portion of the third contact electrode 28_10 that is disposed on the second electrode 22_10 where the second contact hole CT2 is not formed may be in electrical contact with second ends of first light-emitting elements 30A, and portion of the third contact electrode 28_10 that is disposed on the first electrode 21_10 where the first contact hole CT1 is not formed may be in electrical contact with first ends of second light-emitting elements 30B. The portion of the third contact electrode 28_10 that extends in the first direction DR1 may overlap, but may not be directly connected to, the second electrode 22_10 where the second contact hole CT2 is formed, because of the presence of an insulating layer (not illustrated) therebetween.

Electrical signals transmitted from the first contact electrode 26_10 to the first ends of the first-type light-emitting elements 30-1 may be delivered to the third contact electrode 28_10, which is in electrical contact with second ends of the first-type light-emitting elements 30-1. The third contact electrode 28_10 may transmit these electrical signals to the first ends of the second light-emitting elements 30B so that the signals may be transmitted to the second electrodes 22_10 via the second contact electrode 27_10. Accordingly, electrical signals for the light-emitting elements 30 to emit light can be transmitted only to one of the first electrodes 21_10 and the second electrode 22_10, and the first-type light-emitting elements 30-1 and the second-type light-emitting elements 30-2 can be electrically connected in series via the third contact electrode 28_10.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
    a plurality of first banks disposed on a substrate to extend in a first direction and spaced apart from one another;
    a plurality of first patterns disposed between the plurality of first banks and spaced apart from one another in the first direction;
    a first electrode and a second electrode extending in the first direction, disposed on different first banks of the plurality of first banks, and spaced apart from each other;
    a first insulating layer overlapping the plurality of first patterns, disposed on the substrate, and partially overlapping the first and second electrodes; and
    a plurality of light-emitting elements disposed on the first insulating layer so that first and second ends of each of the plurality of light-emitting elements are disposed on the first and second electrodes, respectively, the plurality of light-emitting elements including first light-emitting elements which are disposed between the plurality of first patterns and do not overlap the plurality of first patterns in a thickness direction of the display device.

2. The display device of claim 1, wherein
    the plurality of light-emitting elements further comprise second light-emitting elements which overlap the plurality of first patterns in the thickness direction of the display device, and
    distances between the first light-emitting elements and the substrate are smaller than distances between the second light-emitting elements and the substrate.

3. The display device of claim 1, wherein a thickness of the plurality of first patterns is greater than thicknesses of the first and second electrodes.

4. The display device of claim 3, wherein the thickness of the plurality of first patterns is smaller than a diameter of the plurality of light-emitting elements.

5. The display device of claim 1, wherein
    the plurality of first patterns are disposed between the first and second electrodes, and
    a width of the plurality of first patterns is smaller than a distance between the first and second electrodes.

6. The display device of claim 1, wherein
    a width of the plurality of first patterns is greater than a distance between the first and second electrodes, and
    at least portions of the first and second electrodes are disposed on the plurality of first patterns.

7. The display device of claim 1, further comprising:
    a planarization layer disposed on the substrate, wherein
    the plurality of first banks and the first insulating layer are disposed on the planarization layer, and
    the plurality of first patterns and the planarization layer are integral with each other.

8. The display device of claim 1, wherein the plurality of first patterns overlap portions of the first or second electrode that do not overlap the plurality of first banks and are arranged in the first direction.

9. The display device of claim 8, wherein first patterns of the plurality of first patterns that overlap the first electrode and first patterns of the plurality of first patterns that overlap the second electrode are arranged parallel to a direction in which the first and second electrodes are spaced apart from each other.

10. The display device of claim 8, wherein first patterns of the plurality of first patterns that overlap the first electrode and first patterns of the plurality of first patterns that overlap the second electrode are arranged in a staggered manner.

11. The display device of claim 1, further comprising:
    a first contact electrode disposed on the first electrode to be in electrical contact with first ends of the plurality of light-emitting elements; and a second contact electrode disposed on the second electrode to be in electrical contact with second ends of the plurality of light-emitting elements.

12. The display device of claim 11, wherein
the first electrode includes:
- at least one bent portion which extends in a second direction that is different from the first direction;
- an extended portion which has a greater width than the at least one bent portion; and
- at least one connecting portion which electrically connects the at least one bent portion and the extended portion and extends in the first direction, and the plurality of first patterns are disposed between the extended portion of the first electrode and the second electrode.

13. The display device of claim 12, wherein
the second electrode is symmetrical with the first electrode with respect to the first insulating layer,
the plurality of first patterns are disposed between the extended portion of the first electrode and an extended portion of the second electrode, and
a first end and a second end of each of the plurality of light-emitting elements are disposed on the extended portions of the first and second electrodes, respectively.

14. The display device of claim 12, wherein
a first distance between the extended portion of the first electrode and the second electrode is smaller than a second distance between the at least one connecting portion of the first electrode and the second electrode, and
a minimum distance between the at least one bent portion of the first electrode and the second electrode is greater than the first distance and is smaller than the second distance.

15. A display device comprising:
a planarization layer disposed on the substrate;
a plurality of first banks disposed on the planarization layer and spaced apart from one another;
a first electrode and a second electrode disposed on different first banks of the plurality of first banks and spaced apart from each other;
a first insulating layer disposed on the planarization layer and partially overlapping the first and second electrodes;
first light-emitting elements disposed on the first insulating layer so that a first end and a second end of each of the first light-emitting elements are disposed on the first electrode and the second electrode, respectively; and
second light-emitting elements disposed on the first insulating layer so that a first end and a second end of each of the second light-emitting elements are disposed on the first electrode and the second electrode, respectively, wherein a distance between the first light-emitting elements and the substrate is smaller than a distance between the second light-emitting elements and the substrate,
the planarization layer includes first patterns including top surfaces partially protruding between the plurality of first banks, and
the second light-emitting elements are disposed on the first patterns.

16. The display device of claim 15, wherein
the planarization layer includes portions between the plurality of first banks where the first patterns are not formed, and
the first light-emitting elements are disposed on the portions of the planarization layer where the first patterns are not formed.

17. The display device of claim 15, further comprising:
a transistor disposed between the substrate and the planarization layer; and
a data conductive layer disposed between the transistor and the planarization layer and including a first voltage line and a second voltage line, wherein
the first electrode is electrically connected to the first voltage line via the transistor, and
the second electrode is electrically connected to the second voltage line.

* * * * *